US012581727B2

(12) United States Patent
　Okumura

(10) Patent No.:　US 12,581,727 B2
(45) Date of Patent:　Mar. 17, 2026

(54) ELECTRONIC CIRCUIT AND SEMICONDUCTOR MODULE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 910 days.

(21) Appl. No.: 17/703,631

(22) Filed: Mar. 24, 2022

(65) Prior Publication Data

US 2022/0216199 A1　　Jul. 7, 2022

Related U.S. Application Data

(63) Continuation of application No. PCT/JP2021/006597, filed on Feb. 22, 2021.

(30) Foreign Application Priority Data

Apr. 21, 2020　(JP) ................................ 2020-075679

(51) Int. Cl.
　*H10D 84/80*　　(2025.01)
　*H02M 1/00*　　(2006.01)
　　　(Continued)

(52) U.S. Cl.
　CPC ........ *H10D 84/811* (2025.01); *H02M 1/0051* (2021.05); *H02M 7/003* (2013.01); *H02M 7/5387* (2013.01); *H10D 8/60* (2025.01)

(58) Field of Classification Search
　CPC ...... H10D 8/051; H10D 8/50; H10D 62/8325; H10D 62/8503; H10D 64/01; H10D 64/64;
　　　(Continued)

(56) References Cited

U.S. PATENT DOCUMENTS

| | | | |
|---|---|---|---|
| 2003/0137320 A1 | 7/2003 | Grundl et al. | |
| 2009/0206812 A1 | 8/2009 | Sasaya et al. | |

(Continued)

FOREIGN PATENT DOCUMENTS

| | | |
|---|---|---|
| CN | 102067309 A | 5/2011 |
| CN | 104134663 A | 11/2014 |

(Continued)

OTHER PUBLICATIONS

Japanese Office Action dated Sep. 17, 2024, in the counterpart Japanese Patent Application No. 2023-148732.

(Continued)

*Primary Examiner* — Moin M Rahman
(74) *Attorney, Agent, or Firm* — RABIN & BERDO, P.C.

(57) ABSTRACT

An electronic circuit having a first terminal and a second terminal. The electronic circuit includes a first diode having a PN junction where a forward voltage is a first voltage, a second diode having a Schottky junction where the forward voltage is a second voltage that is smaller than the first voltage, a first wiring member coupling the first terminal to the second terminal via the first diode, and a second wiring member coupling the first terminal to the second terminal via the second diode. The second wiring member has an inductance larger than an inductance of the first wiring member.

17 Claims, 20 Drawing Sheets

(51) Int. Cl.
    *H02M 7/00*         (2006.01)
    *H02M 7/5387*     (2007.01)
    *H10D 8/60*        (2025.01)

(58) Field of Classification Search
    CPC .... H10D 62/126; H10D 62/60; H10D 62/106;
               H10D 62/102; H10D 62/124; H10D
               8/60–605; H10D 8/045; H10D 8/411;
               H10D 8/422; H10D 8/00–825; H10D
               8/041; H10D 84/0193; H10D 84/853;
               H10D 84/85; H10D 30/6728; H10D
               30/6733; H10D 30/6735; H10D 62/118;
               H10D 89/931; H10D 64/252; H10D
               84/0188; H10D 84/201; H10D 18/60;
               H10D 84/811; H01L 21/76224; H01L
               24/06; H01L 24/32; H01L 24/45; H01L
               24/73; H01L 2224/40225; H01L
               2224/45124; H01L 2224/45144; H01L
               2224/45147; H01L 2224/48091; H01L
               2224/48096; H01L 2224/73221; H01L
               2924/00014; H01L 23/645; H01L 24/49;
               H01L 25/072; H01L 2224/0603; H01L
               2224/32225; H01L 2224/48139; H01L
               2224/48227; H01L 2224/4903; H01L
               2224/49111; H01L 2224/49113; H01L
               2224/73265; H01L 2924/19107; H01L
               25/18; H02K 15/027; A23B 2/783; A45C
               11/003; A61K 40/4218; H10F 77/955;
               H10H 20/826; B82Y 10/00; H02M
               1/0051; H02M 7/003; H02M 7/5387;
               H02M 3/003; H03K 17/08142; H03K
               17/122
    See application file for complete search history.

(56) References Cited

U.S. PATENT DOCUMENTS

| | | | |
|---|---|---|---|
| 2011/0062491 | A1 | 3/2011 | Nakata |
| 2013/0082284 | A1 | 4/2013 | Okumura |
| 2014/0001481 | A1* | 1/2014 | Michikoshi ....... H01L 23/49531 |
| | | | 257/76 |
| 2014/0264376 | A1 | 9/2014 | Lutz et al. |
| 2015/0023081 | A1 | 1/2015 | Obiraki et al. |
| 2015/0223339 | A1 | 8/2015 | Nakamura et al. |
| 2017/0213806 | A1 | 7/2017 | Nishimura |
| 2019/0103866 | A1* | 4/2019 | Sakai ................... H03K 17/145 |
| 2019/0273489 | A1* | 9/2019 | Takano ............... H03K 17/162 |
| 2020/0185359 | A1 | 6/2020 | Nakashima et al. |
| 2021/0320045 | A1* | 10/2021 | Hwang ............... H10D 10/821 |

FOREIGN PATENT DOCUMENTS

| | | | |
|---|---|---|---|
| CN | 104919589 | A | 9/2015 |
| JP | 2003-536363 | A | 12/2003 |
| JP | 2009-195054 | A | 8/2009 |
| JP | 2011-250589 | A | 12/2011 |
| JP | 2014225706 | A | 12/2014 |
| JP | 2017130621 | A | 7/2017 |
| JP | 2020-009834 | A | 1/2020 |
| WO | 2019044748 | A1 | 3/2019 |

OTHER PUBLICATIONS

International Search Report for PCT/JP2021/006597, mailed on Apr. 27, 2021.

Office Action issued for corresponding Chinese patent application No. 202180005459.9 on Jan. 24, 2026.

\* cited by examiner

ELECTRONIC CIRCUIT AND SEMICONDUCTOR MODULE

CROSS-REFERENCE TO RELATED APPLICATION

This is a continuation application of International Patent Application No. PCT/JP2021/006597 filed Feb. 22, 2021, which claims the benefit of priority to Japanese Patent Application No. 2020-075679 filed Apr. 21, 2020, the entire contents of each of which are hereby incorporated herein by reference.

BACKGROUND

Technical Field

The present disclosure relates to an electronic circuit and a semiconductor module.

Description of the Related Art

There is a bridge circuit serving as a circuit including a switching device of an upper arm and a switching device of a lower arm to drive a load (for example, Japanese Patent Application Publication No. 2020-009834).

Meanwhile, when the switching device of the lower arm is turned off, for example, the current flowing through the switching device of the lower arm generally flows through a parasitic diode in the switching device of the upper arm and a free-wheeling diode coupled to the switching device of the upper arm.

However, when a forward voltage of the parasitic diode is larger than a forward voltage of the free-wheeling diode, most of the current flowing through the load will flow through the free-wheeling diode. This may cause breakdown of the free-wheeling diode.

SUMMARY

A first aspect of the present disclosure is an electronic circuit having a first terminal and a second terminal, the electronic circuit comprising: a first diode having a PN junction where a forward voltage is a first voltage; a second diode having a Schottky junction where the forward voltage is a second voltage that is smaller than the first voltage; a first wiring member coupling the first terminal to the second terminal via the first diode; and a second wiring member coupling the first terminal to the second terminal via the second diode, the second wiring member having an inductance larger than an inductance of the first wiring member.

In addition, a second aspect of the present disclosure is a semiconductor module comprising an electronic circuit having a first terminal and a second terminal, the electronic circuit comprising: a first diode having a PN junction where a forward voltage is a first voltage; a second diode having a Schottky junction where the forward voltage is a second voltage that is smaller than the first voltage; a first wiring member coupling the first terminal to the second terminal via the first diode; and a second wiring member coupling the first terminal to the second terminal via the second diode, the second wiring member having an inductance larger than an inductance of the first wiring member.

DETAILED DESCRIPTION

At least following matters will become apparent from the descriptions of the present specification and the accompanying drawings.

[Embodiments]

<<<Example of Electronic Circuit 10>>>

Figure 1:
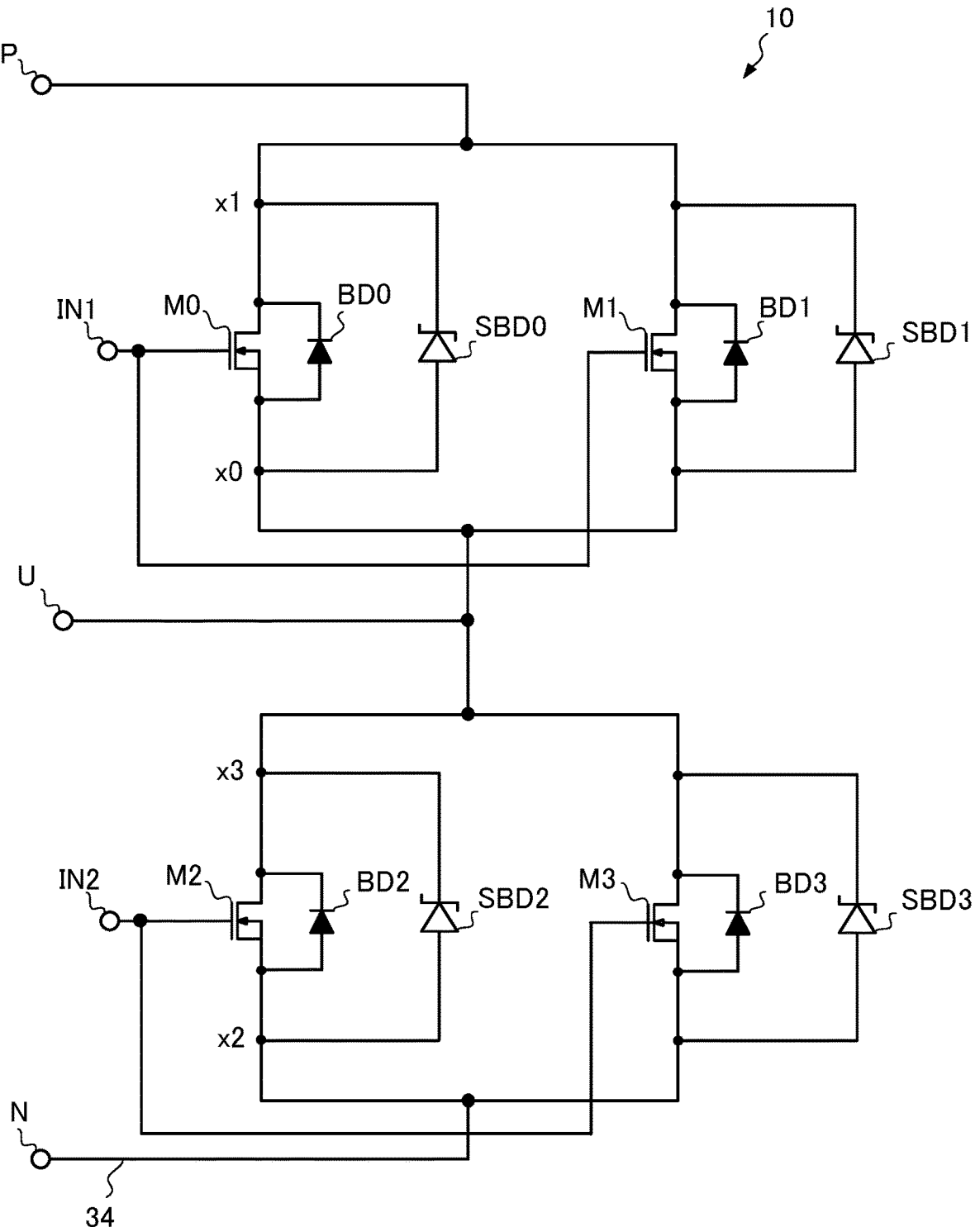
FIG. 1 is a diagram illustrating an example of an electronic circuit 10.

FIG. 1 is a diagram illustrating a configuration of an electronic circuit 10 according to an embodiment of the present disclosure. The electronic circuit 10 is a half-bridge circuit for driving a load (not illustrated) such as a motor coil, and includes n-Type Metal-Oxide-Semiconductor Field-Effect-Transistors (NMOS transistors) M0 to M3, diodes SBD0 to SBD3, a positive electrode terminal P, an output terminal U, a negative electrode terminal N, and control terminals IN1 and IN2.

The NMOS transistor M0 is a switching device of an upper arm having its gate electrode (control electrode) coupled to the control terminal IN1 of the upper arm, its source electrode coupled to the output terminal U, and its drain electrode coupled to the positive electrode terminal P. The NMOS transistor M0 also includes a diode BD0 as a parasitic diode (i.e., a body diode).

The NMOS transistor M1 is a switching device of the upper arm, similarly to the NMOS transistor M0, and includes a diode BD1.

The NMOS transistor M2 is a switching device of a lower arm having its gate electrode coupled to the control terminal IN2 of the lower arm, its source electrode coupled to the negative electrode terminal N, and its drain electrode coupled to the output terminal U. The NMOS transistor M2 includes a diode BD2 as a parasitic diode.

The NMOS transistor M3 is a switching device of the lower arm, similarly to the NMOS transistor M2, and includes a diode BD3.

Here, in an embodiment of the present disclosure, a MOS transistor is used as the switching device, but the present disclosure is not limited thereto. As the switching device, a Reverse Conducting (RC)-Insulated Gate Bipolar Transistor (IGBT) may be used, which is a reverse conduction type IGBT and includes a bipolar transistor and a diode. In the case of the RC-IGBT, PN junction diodes formed inside may serve as the diodes BD0 to BD3.

The diodes BD0 to BD3 of an embodiment of the present disclosure are PN junction diodes. The NMOS transistors M0 to M3 of an embodiment of the present disclosure are devices manufactured using Silicon Carbide (SiC) which is a wide bandgap semiconductor. Thus, a forward voltage Vf1 (first voltage) of the diodes BD0 to BD3, which are body diodes, takes a value (for example, 2.5 V) based on the SiC PN junction.

A diode SBD0 is a Schottky barrier diode including a Schottky junction between metal and n-type SiC, and is coupled in anti-parallel to the NMOS transistor M0. Diodes SBD1 to SBD3 are also SiC Schottky barrier diodes similar to the diode SBD0, and are coupled in anti-parallel to the NMOS transistors M1 to M3, respectively. Accordingly, the diodes SBD0 to SBD3 operate as free-wheeling diodes. A forward voltage Vf2 (second voltage) of the diodes SBD0 to SBD3 takes a value (for example, 0.7 V) based on the Schottky junction.

Although the switching device and the free-wheeling diode are manufactured using SiC in an embodiment of the present disclosure, other wide bandgap semiconductors such as Gallium Nitride (GaN) may also be used. The free-wheeling diode may be a Schottky barrier diode including a Schottky junction of metal and Si.

The positive electrode terminal P is a power supply-side (or high-side) terminal, while the negative electrode terminal N is a ground-side (or low-side) terminal. The output terminal U is a terminal to which a load is coupled. A signal for controlling switching of the NMOS transistors M0 and M1, which are the switching devices of the upper arm, is inputted to the control terminal IN1. A signal for controlling switching of the NMOS transistors M2 and M3, which are the switching devices of the lower arm, is inputted to the control terminal IN2.

In the electronic circuit 10 as described above, the switching devices of the upper arm and the switching devices of the lower arm are turned on and off, to thereby drive the load. In the electronic circuit 10, when the switching devices of the upper arm and the switching devices of the lower arm are simultaneously turned on to drive the load, a large through current flows from the positive electrode terminal P to the negative electrode terminal N. Accordingly, when the load is driven, a dead time period is provided during which the switching devices of the upper arm and the switching devices of the lower arm are both off. In the dead time period, a current may flow from the output terminal U to the positive electrode terminal P, for example. Further, in the dead time period, a current may flow from the negative electrode terminal N to the output terminal U, for example.

<<<Current from Output Terminal U to Positive Electrode Terminal P>>>

Figure 2:
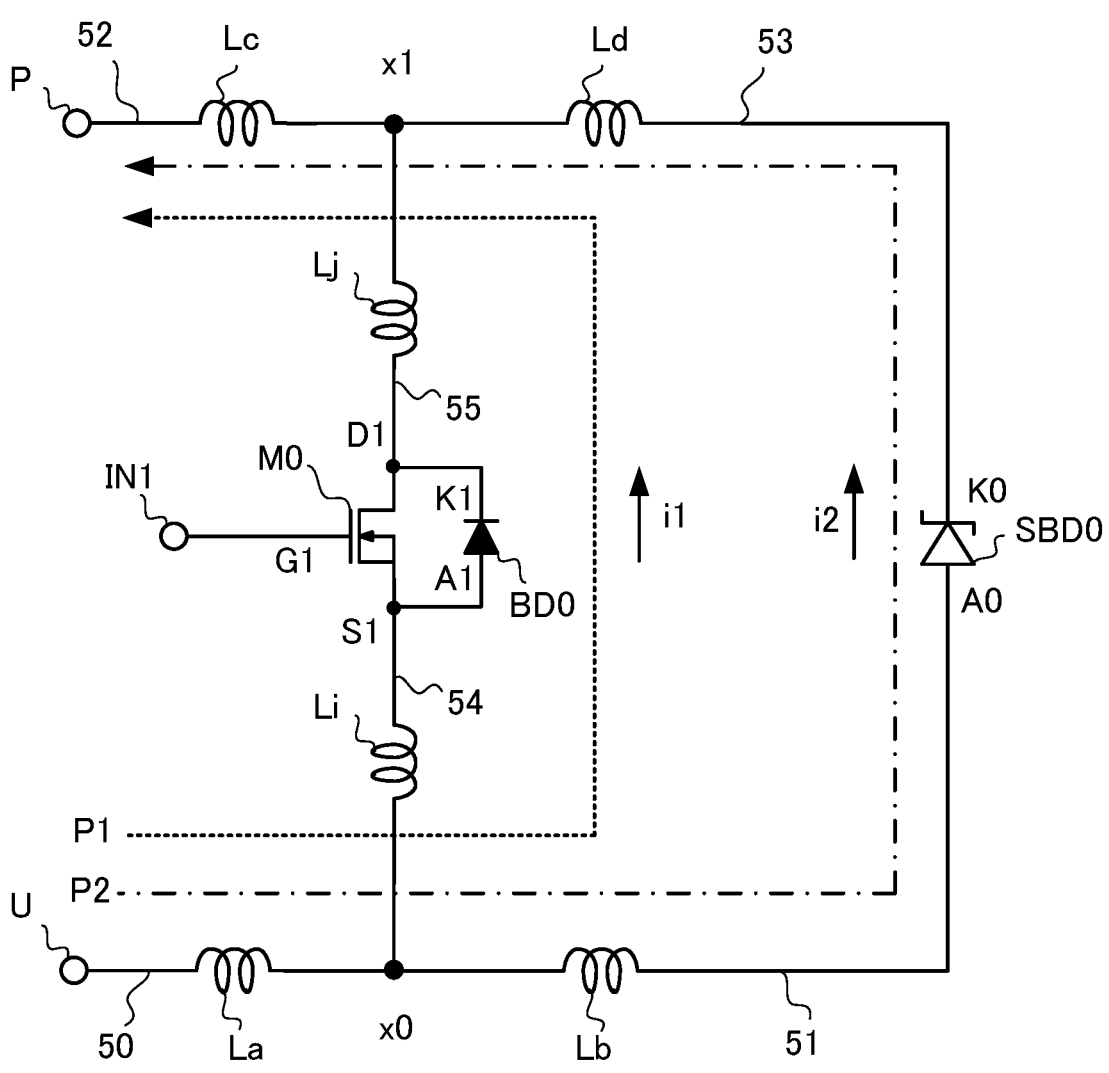
FIG. 2 is a diagram for explaining a current flowing through diodes BD0 and SBD0 of an upper arm.

FIG. 2 is a diagram for explaining a current flowing through the diodes BD0 and SBD0 of the upper arm in the dead time period, for example. In an embodiment of the present disclosure, the current flowing through the diodes BD0 and SBD0 is similar to that flowing through the diodes BD1 and SBD1 in the dead time period, and thus only the current flowing through the diodes BD0 and SBD0 will be described here.

A node x0 in FIG. 2 is a node at which a wiring from the output terminal U, a wiring from the source electrode S1 of the NMOS transistor M0, and a wiring from an anode electrode A0 of the diode SBD0 are coupled in FIG. 1. Likewise, a node x1 is a node at which a wiring from the positive electrode terminal P, a wiring from a drain electrode D1 of the NMOS transistor M0, and a wiring from a cathode electrode K0 of the diode SBD0 are coupled. Note that, hereinafter, the anode electrode is referred to as anode, and the cathode electrode is referred to as cathode.

Here, it is assumed that the wiring between the output terminal U and the node x0 is a wiring 50 of an inductance La, and that the wiring between the node x0 and the anode A0 of the diode SBD0 is a wiring 51 of an inductance Lb. It is also assumed that the wiring between the positive electrode terminal P and the node x1 is a wiring 52 of an inductance Lc, and that the wiring between the node x1 and the cathode K0 of the diode SBD0 is a wiring 53 of an inductance Ld. It is further assumed that the wiring between the source electrode S1 of the NMOS transistor M0 and the node x0 is a wiring 54 of an inductance Li, and that the wiring between the drain electrode D1 of the NMOS transistor M0 and the node x1 is a wiring 55 of an inductance Lj. The inductances La to Ld, Li, and Lj are parasitic inductances of the wirings 50 to 55.

Here, as described above, the diode BD0 is the body diode having the forward voltage Vf1 (for example, 2.5 V) based on the Sic PN junction, and the diode SBD0 is the Schottky diode having the forward voltage Vf2 (for example, 0.7 V) based on the SiC Schottky junction.

Thus, the current from the output terminal U first flows to the positive electrode terminal P through a path P2 indicated by the dashed-dotted line via the diode SBD0. In this event, a voltage Vx01 between the nodes x0 and x1 is given by the following expression (1).

$$V \times 01 = (Lb + Ld) \times di2/dt + Vf2 \qquad (1)$$

In the expression (1), the current flowing through the path P2 is i2, and di2/dt is a change with time of the current i2 flowing through the path P2. The change with time of the current i2 is a value determined based on the current flowing through the load and the time from turning on to turning off of the switching device, for example, which is 0.1 to 10 A/nsec, for example.

Here, when the values of the inductances Lb and Ld are small and the voltage Vx01 does not exceed the forward voltage Vf1 (for example, 2.5 V), for example, all the current flowing from the output terminal U flows through the path P2. As a result, the current i2 may exceed a rated current of the diode SBD0, resulting in breakdown of the diode SBD0. Thus, in an embodiment of the present disclosure, the values of the inductances Lb and Ld are increased such that the current from the output terminal U flows to the positive electrode terminal P not only through the path P2 but also through a path P1 indicated by the dotted line via the diode BD0. The values of the inductances Lb and Ld are calculated based on the relationship given by the expression (2).

$$(Lb + Ld) \times di2 / dt + Vf2 > (Li + Lj) \times di1 / dt + Vf1 \tag{2}$$

When the expression (2) is modified such that the forward voltage Vf1 is 2.5 V, the forward voltage Vf2 is 0.7 V, and di2/dt (=di1/dt) is 10 A/nsec, the following relational expression (3) is obtained.

$$((Lb + Ld) - (Li + Lj)) > \tag{3}$$
$$(Vf1 - Vf2) \times dt / di2 > (2.5 - 0.7) \times (1 / 10) > 0.18$$

As a result, by setting the sum of the inductances Lb and Ld to be larger than the sum of the inductances Li and Lj, for example, to be larger than 0.18 nH, the currents i1 and i2 flow through the paths P1 and P2, respectively, and thus a large current can be avoided from flowing through the diode SBD0.

As such, in an embodiment of the present disclosure, the inductance of the wiring on the path P2 is set larger than the inductance of the wiring on the path P1 such that the diode BD0 is turned on when the current flows from the output terminal U. As a result, it is possible to reduce the current i2 flowing through the diode SBD0 in the currents from the output terminal U, thereby being able to avoid breakdown of the diode SBD0.

In FIG. 2, three wirings 50, 51, and 54 are modeled as the wirings coupled to the node x0, for example, but when the node x0 corresponds to the source electrode S1, the inductance Li of the wiring 54 can be ignored, resulting in Li=0. Meanwhile, when the node x0 corresponds to the output terminal U, for example, the inductance La of the wiring 50 can be ignored, resulting in La=0. Accordingly, although the details will be described later, various semiconductor modules can be represented by equivalent circuits, with the use of the circuit illustrated in FIG. 2.

Note here that the diode BD0 corresponds to a "first diode", and the diode SBD0 corresponds to a "second diode". The output terminal U corresponds to a "first terminal", and the positive electrode terminal P corresponds to a "second terminal". The wirings 50, 52, 54, and 55 coupling the output terminal U to the positive electrode terminal P via the diode BD0 correspond to a "first wiring member", and the wirings 50 to 53 coupling the output terminal U to the positive electrode terminal P via the diode SBD0 correspond to a "second wiring member".

Although the forward voltage Vf1 is 2.5 V and the forward voltage Vf2 is 0.7 V in an embodiment of the present disclosure, these values are just examples. The values of the forward voltages Vf1 and Vf2 and the values of the inductances of the wirings vary depending on the manufacturing variations.

In addition, the sum of the required inductances Lb and Ld also changes with the time, current, and temperature used. Thus, the inductance of the "second wiring member" at least has to be larger than the inductance of the "first wiring member". The inductance of the "second wiring member" is larger than the inductance of the "first wiring member", preferably, by 0.18 nH or more, more preferably, by 0.36 nH or more.

<<Current from Negative Electrode Terminal N to Output Terminal U>>

Figure 3:
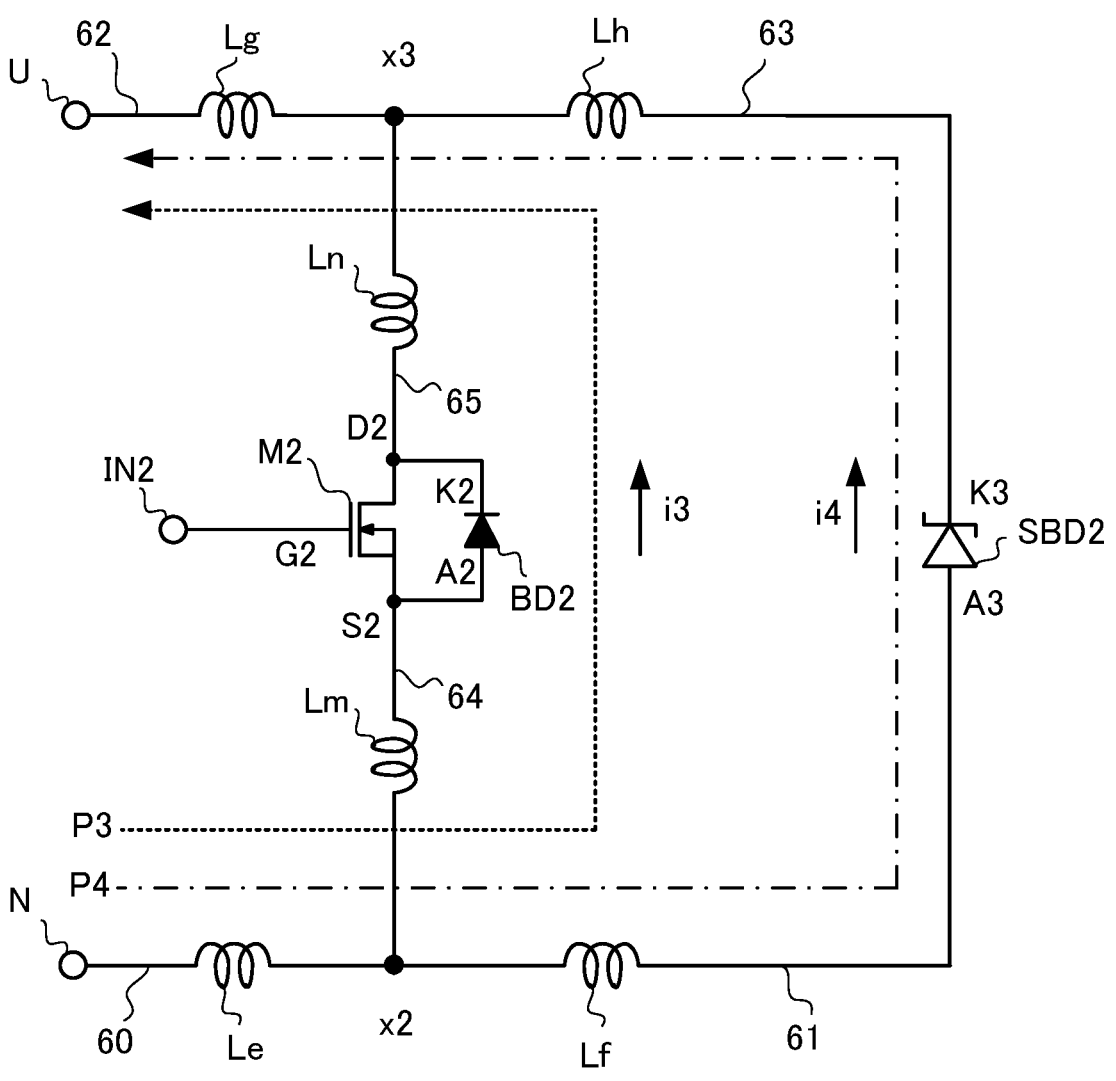
FIG. 3 is a diagram for explaining a current flowing through diodes BD2 and SBD2 of a lower arm.

FIG. 3 is a diagram for explaining a current flowing through the diodes SBD2 and BD2 of the lower arm in the dead time period, for example. In an embodiment of the present disclosure, the current flowing through the diodes BD2 and SBD2 is similar to that flowing through the diodes BD3 and SBD3 in the dead time period, and thus only the current flowing through the diodes BD2 and SBD2 will be described here.

A node x2 in FIG. 3 is a node at which a wiring from the negative electrode terminal N, a wiring from a source electrode S2 of the NMOS transistor M2, and a wiring from an anode A3 of the diode SBD2 are coupled in FIG. 1. Likewise, a node x3 is a node at which a wiring from the output terminal U, a wiring from a drain electrode D2 of the NMOS transistor M2, and a wiring from a cathode K3 of the diode SBD2 are coupled.

Here, it is assumed that the wiring between the negative electrode terminal N and the node x2 is a wiring 60 of an inductance Le, and that the wiring between the node x2 and the anode A3 of the diode SBD2 is a wiring 61 of an inductance Lf. It is also assumed that the wiring between the output terminal U and the node x3 is a wiring 62 of an inductance Lg, and that the wiring between the node x3 and the cathode K3 of the diode SBD2 is a wiring 63 of an inductance Lh. It is further assumed that the wiring between the source electrode S2 of the NMOS transistor M2 and the node x2 is a wiring 64 of an inductance Lm, and that the wiring between the drain electrode D2 of the NMOS transistor M2 and the node x3 is a wiring 65 of an inductance Ln. The inductances Le to Lh, Lm, and Ln are parasitic inductances of the wirings 60 to 65.

In an embodiment of the present disclosure, similarly to the upper arm illustrated in FIG. 2, the values of the inductances Lf and Lh are increased such that a current i3 flows through a path P3 indicated by the dotted line via the diode BD2 and a current i4 flows through a path P4 indicated by the dashed-dotted line via the diode SBD2, upon a current flowing from the negative electrode terminal N. To be more specific, for example, (Lf+Lh)−(Lm+Ln)>0.18 nH holds based on the foregoing expression (3). As a result, when the current flows from the negative electrode terminal N, it is avoided that a large current flowing through the diode SBD2 of the lower arm resulting in breakdown of the diode SBD2.

In such a case, the diode BD2 corresponds to the "first diode", and the diode SBD2 corresponds to the "second diode". The negative electrode terminal N corresponds to the "first terminal", and the output terminal U corresponds to the "second terminal". The wirings 60, 62, 64, and 65 coupling the negative electrode terminal N to the output terminal U via the diode BD2 correspond to the "first wiring member", and the wirings 60 to 63 coupling the negative electrode terminal N to the output terminal U via the diode SBD2 correspond to the "second wiring member".

===Example of Semiconductor Module 80===

Figure 4:
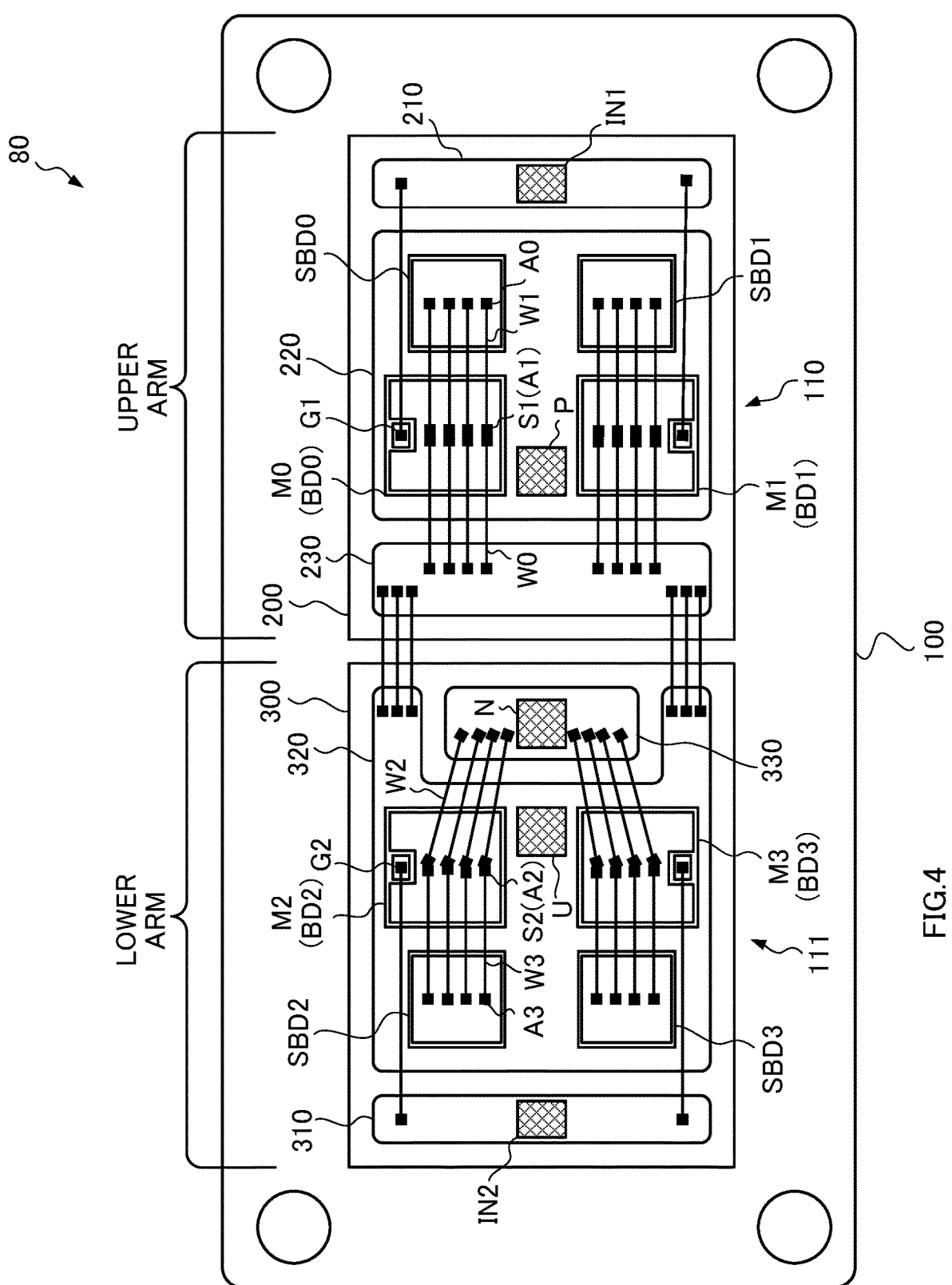
FIG. 4 is a schematic plan view of a semiconductor module 80.
Figure 5:
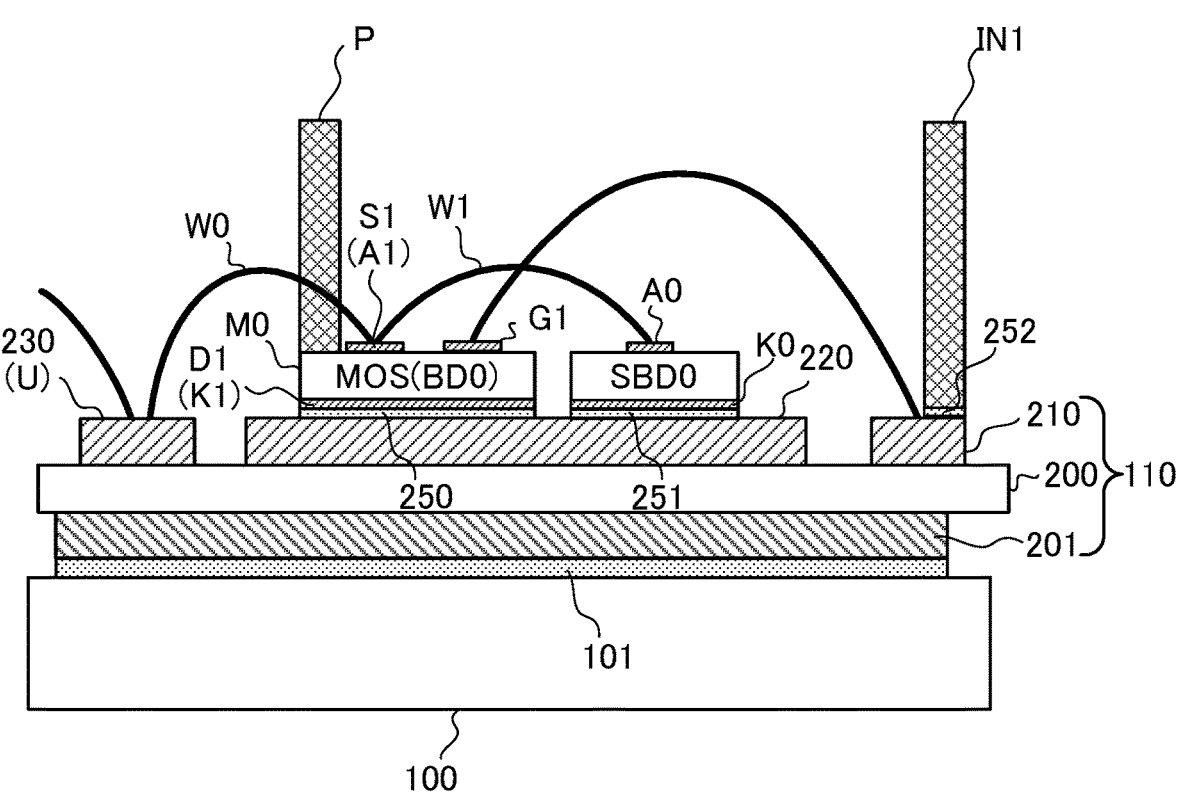
FIG. 5 is a schematic diagram for explaining a configuration of a semiconductor module 80.

FIG. 4 is a schematic plan view illustrating an example of a semiconductor module 80 which embodies the electronic circuit 10. FIG. 5 is a schematic diagram for explaining a configuration of the semiconductor module 80. In an embodiment of the present disclosure, the plurality of switching devices and free-wheeling diodes in the electronic circuit 10 are mounted to the semiconductor module 80, with the same configuration. Accordingly, for convenience, FIG. 5 illustrates only the NMOS transistor M0 and the diode SBD0 of the upper arm.

The gate electrode G1 and the source electrode S1 of the NMOS transistor M0 are formed on the central axis of the NMOS transistor M0, for example, but are illustrated separately here for convenience. Hereinafter, in an embodiment of the present disclosure, "electrically coupled" means that a configuration E1 and a configuration E2 are coupled so as to be electrically continuous through a wiring, a bonding material (for example, solder) or the like. This is also simply referred to as "coupling". This "coupling" includes not only a case where the configuration E1 is coupled to the configuration E2 through a wiring member but also a case where the configuration E1 is coupled to the configuration E2 through a conductive pattern or the like provided between the configurations E1 and E2.

The semiconductor module 80 is a semiconductor device including a plurality of switching devices and free-wheeling diodes of the electronic circuit 10. In FIG. 4, the switching devices are the NMOS transistors M0 to M3, and the free-wheeling diodes are the diodes SBD0 to SBD3. The semiconductor module 80 includes: laminated substrates 110 and 111 including conductive patterns 210, 220, 230, 310, 320, and 330; switching devices and free-wheeling diodes arranged in the conductive patterns 220 and 320; terminals arranged in conductive patterns 210, 220, 310, 320, and 330, and bonding wires electrically coupled to the switching devices and free-wheeling diodes and to the conductive patterns. The semiconductor module 80 may further include a base plate 100.

The terminals each have a prismatic shape, for example, and have one end bonded to the conductive pattern and the other end extending from the semiconductor module 80 to be electrically coupled to an external device (not illustrated). The terminals are made of, for example, copper, aluminum or an alloy containing them.

The bonding wires are made of copper, aluminum, gold or an alloy containing them. A member other than the bonding wires can also be used as the wiring member. For example, a lead frame can be used as the wiring member.

The base plate 100 has a smooth bonding surface where an insulating circuit board is bonded on its upper surface, and has a rectangular shape in plan view, for example. The base plate 100 is a metal plate made of aluminum, copper, or an alloy containing them, for example. As illustrated in FIG. 5, the laminated substrate 110 is attached to the base plate 100 with a bonding material 101 such as solder provided therebetween. The laminated substrate 111 also has a configuration similar to that of the laminated substrate 110, and is attached to the same base plate 100 as the laminated substrate 110 is attached to.

<<Laminated Substrate 110 on Upper Arm Side>>

The laminated substrate 110 includes an insulating plate 200 and conductive patterns 210, 220, and 230 formed in the front surface (upper side) of the insulating plate 200. The insulating plate 200 is made of, for example, ceramics or resin. The conductive patterns 210, 220, and 230 are made of, for example, copper, aluminum, or an alloy containing them. The laminated substrate 110 may further include a heat radiation plate 201 on the back surface (lower side) of the insulating plate 200. The insulating circuit board configured as such is formed of a Direct Copper Bonding (DCB) board or an Active Metal Brazing (AMB) board, for example. In an embodiment of the present disclosure, the laminated substrate 110 is a Direct Bonded Copper (DBC) substrate to which the devices of the upper arm are mounted.

<<Conductive Pattern 210>>

The conductive pattern 210 has a control terminal IN1 mounted thereto, to receive signals for controlling the switching devices of the upper arm. Here, as illustrated in FIG. 5, the control terminal IN1 is attached to the conductive pattern 210 through a bonding material 252 (for example, solder). The conductive pattern 210 is coupled to the gate electrode G1 of the NMOS transistor M0 through a bonding wire (hereinafter, simply referred to as wire), and is coupled to the gate electrode of the NMOS transistor M1 through a wire.

In an embodiment of the present disclosure, in the upper arm, the coupling relationship between the output terminal U, the positive electrode terminal P, and the control terminal IN1, and the NMOS transistor M1 and the diode SBD1 is the same as that among the NMOS transistor M0 and the diode SBD0, the output terminal U, the positive electrode terminal P, and the control terminal IN1. Accordingly, the NMOS transistor M0 and the diode SBD0 will be mainly described here.

<<Conductive Pattern 220>>

The positive electrode terminal P on the power supply side, the NMOS transistors M0 and M1, and the diodes SBD0 and SBD1 are mounted to the conductive pattern 220. Here, as illustrated in FIG. 5, a drain electrode D1 formed in the back surface of the NMOS transistor M0 is attached to the conductive pattern 220 through a bonding material 250 (for example, solder). In an embodiment of the present disclosure, a cathode K1 of the diode BD0 is shared with the drain electrode D1, which results in the cathode K1 of the diode BD0 being also coupled to the conductive pattern 220.

A cathode K0 of the diode SBD0 is also attached to the conductive pattern 220 through a bonding material 251. A positive electrode terminal P is further attached to the conductive pattern 220 through a bonding material.

Here, the anode A0 formed in the front surface of the diode SBD0 and the source electrode S1 formed in the front surface of the NMOS transistor M0 are electrically coupled through a wire W1. The anode A1 of the diode BD0 is shared with the source electrode S1, which results in the anode A1 of the diode BD0 being coupled to the anode A0 of the diode SBD0 through the wire W1.

Figure 6:
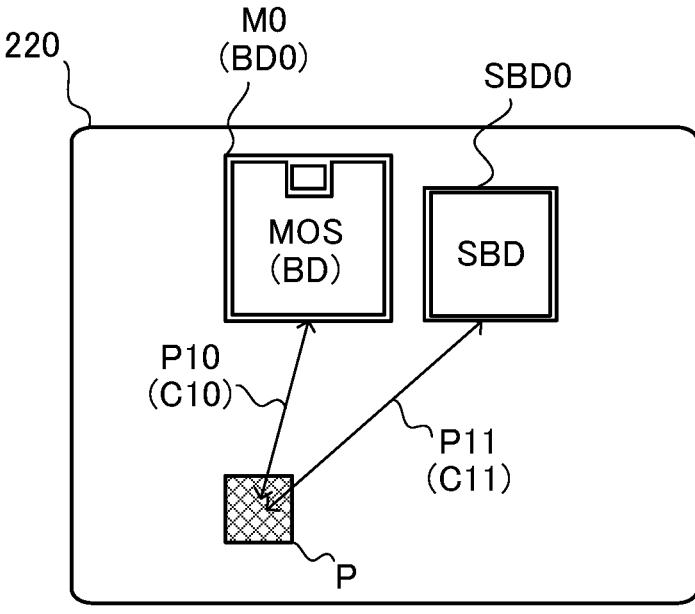
FIG. 6 is a diagram for explaining a wiring pattern conceptually formed in a conductive pattern 220.

FIG. 6 is a diagram for explaining a wiring pattern conceptually generated in the conductive pattern 220. In the conductive pattern 220, a current from the cathode K1 of the diode BD0 flows along a path P10 between the cathode K1 and the positive electrode terminal P, for example. Likewise, a current from the cathode K0 of the diode SBD0 flows along a path P11 between the cathode K0 and the positive electrode terminal P. Accordingly, wiring patterns corresponding to the paths P10 and P11, respectively, are generated in the conductive pattern 220.

Hereinafter, in an embodiment of the present disclosure, the wiring pattern corresponding to the path P10 is referred to as wiring pattern C10, and the wiring pattern corresponding to the path P11 is referred to as wiring pattern C11. Since the path P11 is longer than the path P10, the wiring pattern C11 is longer than the wiring pattern C10. Accordingly, the wiring pattern C11 has an inductance larger than that of wiring pattern C10.

The NMOS transistor M1 and the diode SBD1 are also mounted to the conductive pattern 220 similarly to the NMOS transistor M0 and the diode SBD0, and thus detailed description thereof is omitted here. Further, the "wiring pattern" is a wiring conceptually formed in part of the conductive pattern here, but may also be a wiring that is actually patterned.

<<Conductive Pattern 230>>

The conductive pattern 230 in FIG. 4 is a pattern electrically coupled to the output terminal U, more specifically, a pattern coupled to a wire from a conductive pattern 320 (to be described later) having the output terminal U mounted thereto. The conductive pattern 230 is coupled to the source electrode S1 of the NMOS transistor M0 and the anode A1 of the diode BD0 through a wire W0. A wire W1 from the source electrode S1 is coupled to the anode A0 of the diode SBD0.

<<Laminated Substrate 111 on Lower Arm Side>>

The laminated substrate 111 is a DBC substrate to which the devices of the lower arm are mounted. The laminated substrate 111 has a configuration similar to that of the laminated substrate 110, and thus detailed description thereof is omitted. Conductive patterns 310, 320, and 330 are formed in the front surface of an insulating plate 300 in the laminated substrate 111.

<<Conductive Pattern 310>>

The conductive pattern 310 has a control terminal IN2 mounted thereto, to receive signals for controlling the switching devices of the lower arm. The control terminal IN2 is attached to the conductive pattern 310 through a bonding material (for example, solder). The conductive pattern 310 is coupled to the gate electrode G2 of the NMOS transistor M2 through a wire, and is coupled to the gate electrode of the NMOS transistor M3 through a wire.

In the lower arm, the coupling relationship between the output terminal U, the negative electrode terminal N, and the control terminal IN2, and the NMOS transistor M2 and the diode SBD2 is the same as the coupling relationship between the output terminal U, the negative electrode terminal N, and the control terminal IN2, and the NMOS transistor M3 and the diode SBD3. Accordingly, the NMOS transistor M2 and the diode SBD2 will be mainly described.

<<Conductive Pattern 320>>

An output terminal U, to which a load is to be coupled, NMOS transistors M2 and M3, and diodes SBD2 and SBD3 are mounted to the conductive pattern 320. The coupling relationship between these elements and the conductive pattern 320 is the same as the coupling relationship between the conductive pattern 220 and the NMOS transistor M0 and the diode SBD0 described in FIG. 5.

To be more specific, the drain electrode D2 in the back surface side of the NMOS transistor M2 and the cathode K2 shared with the drain electrode D2 are coupled to the conductive pattern 320 through a bonding material. The cathode K3 formed in the back surface of the diode SBD2 is also coupled to the conductive pattern 320 through a bonding material. The output terminal U is further attached to the conductive pattern 320 through a bonding material.

Here, the anode A3 formed in the front surface of the diode SBD2 and the source electrode S2 formed in the front surface of the NMOS transistor M2 are electrically coupled through a wire W3. The anode A2 of the diode BD2 is shared with the source electrode S2, which results in the anode A3 of the diode SBD2 and the anode A2 of the diode BD2 being coupled through the wire W3.

In this event, a distance from the cathode K3 of the diode SBD2 to the output terminal U is longer than a distance from the cathode K2 of the diode BD2 to the output terminal U. Accordingly, the wiring pattern from the output terminal U to the diode SBD2 has an inductance larger than that of the wiring pattern from the output terminal U to the diode BD2. Here, the "distance (or path)" from the output terminal U to the cathode K3 of the diode SBD2 is determined by, for example, the center of the electrode of the cathode K3 and the center of the output terminal U.

The NMOS transistor M3 and the diode SBD3 are coupled to the conductive pattern 320 in a configuration similar to that in which the NMOS transistor M2 and the diode SBD2 are coupled thereto, and thus detailed description thereof is omitted here.

<<Conductive Pattern 330>>

The conductive pattern 330 has a ground-side negative electrode terminal N mounted thereto. The negative electrode terminal N is attached to the conductive pattern 330 through a bonding material (for example, solder). The conductive pattern 330 is coupled to the source electrode S2 of the NMOS transistor M2 through a wire W2, and is coupled to the source electrode of the NMOS transistor M3 through a wire.

<<Current from Output Terminal U to Positive Electrode Terminal P>>

Figure 7:
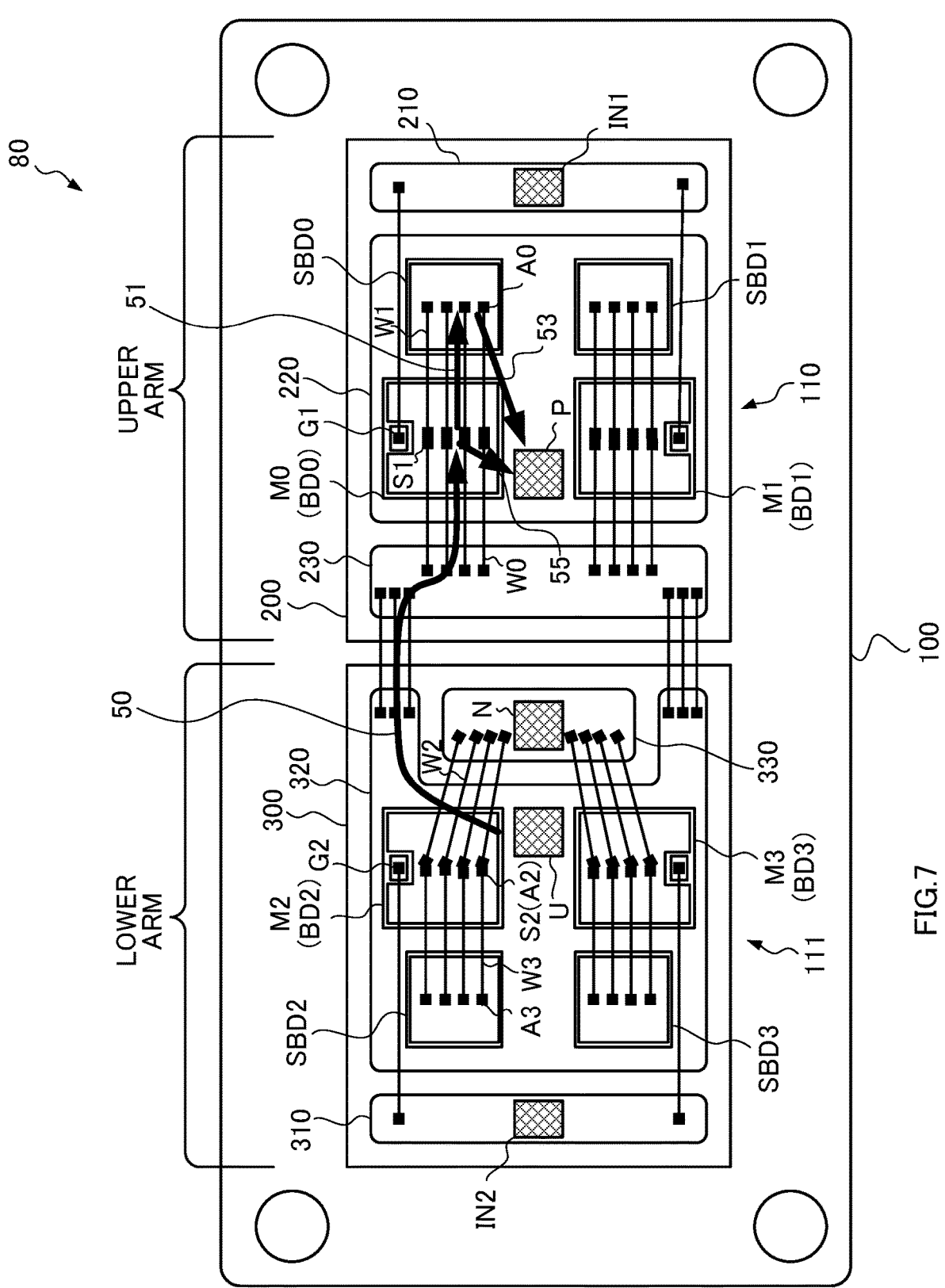
FIG. 7 is a diagram for explaining a current flowing through a device in an upper arm of a semiconductor module 80.

Here, in the semiconductor module 80, a current from the output terminal U to the positive electrode terminal P will be described with reference to FIGS. 7 and 8. The current from the output terminal U flows to the source electrode S1 of the NMOS transistor M0 (the anode A1 of the diode BD0) through the conductive pattern 320, the wire coupled to the conductive patterns 320 and 230, the conductive pattern 230, and the wire W0. The current from the wire W0 is supplied to the anode A0 of the diode SBD0 through the wire W1.

Figure 8:
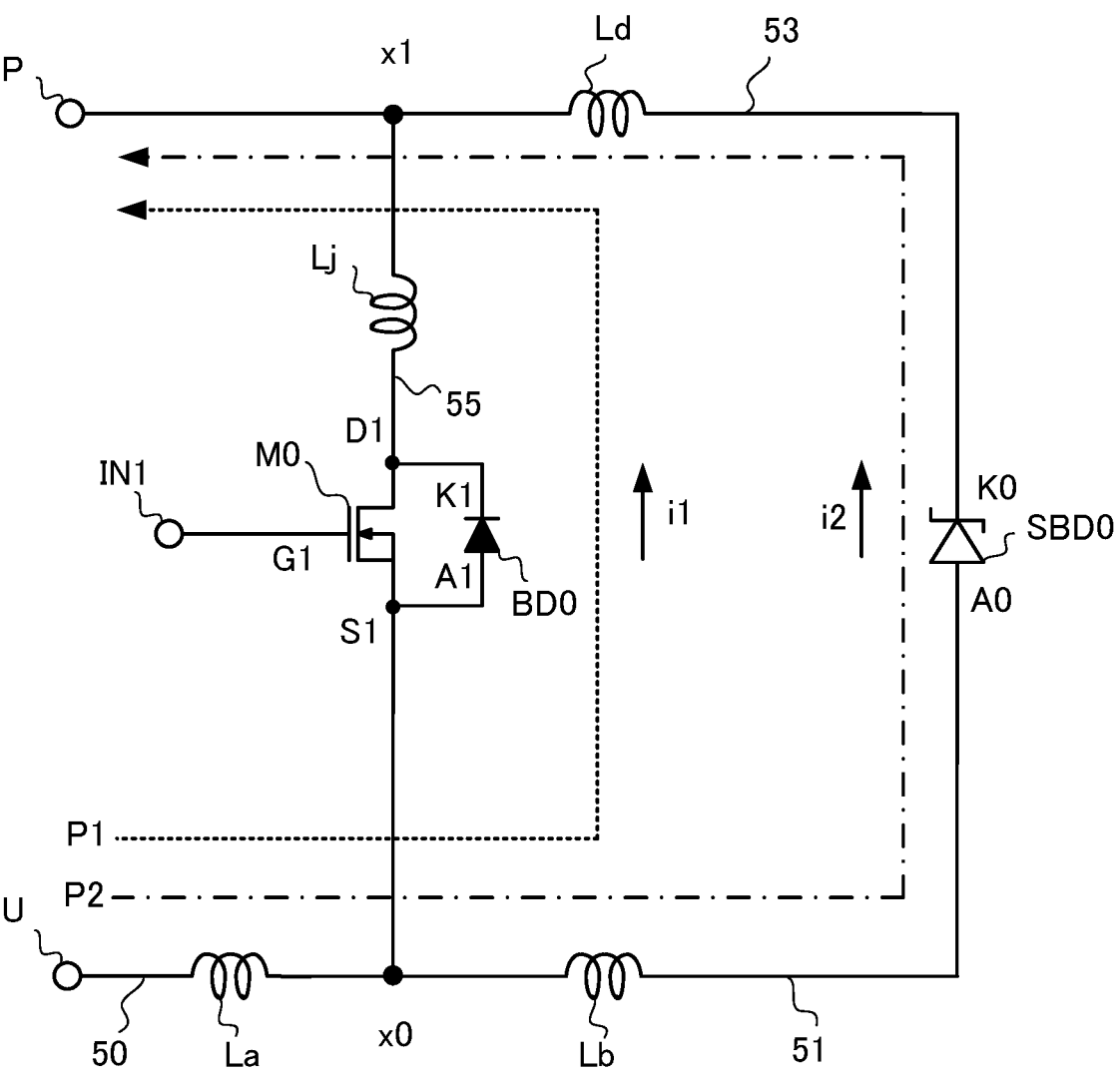
FIG. 8 is a diagram illustrating an example of an equivalent circuit of a device in an upper arm.

Here, the wiring from the output terminal U to the source electrode S1 of the NMOS transistor M0 (the anode A1 of the diode BD0) can be equivalently represented as a wiring 50 in FIG. 8. The wire W1 from the source electrode S1 to the anode A0 of the diode SBD0 can be equivalently represented as a wiring 51. The configurations and components denoted by the same reference numerals are the same between FIGS. 8 and 2.

A current supplied to the anode A1 of the diode BD0 flows to the positive electrode terminal P through the cathode K1 in the back surface and a wiring pattern C10 in FIG. 6. The current supplied to the anode A0 of the diode SBD0 flows to the positive electrode terminal P through the cathode K0 in the back surface and a wiring pattern C11 in FIG. 6. Here, the wiring pattern C10 from the cathode K1 to the positive electrode terminal P can be equivalently represented as a wiring 55 in FIG. 8, and the wiring pattern C11 from the cathode K0 to the positive electrode terminal P can be equivalently represented as a wiring 53.

Then, in an embodiment of the present disclosure, the inductance of the wiring on the path P2 in FIG. 8 is increased such that the conditions of the expression (3) are satisfied. More specifically, for example, the inductances Lb and Ld are increased such that the difference between the inductance (La+Lb+Ld) on the path P2 and the inductance (La+Lj) on the path P1 is 0.18 nH or more.

As a result, the current it supplied to the source electrode S1 in the front surface of the NMOS transistor M0 (the anode A1 of the diode BD0), in the currents from the output terminal U, flows from the anode A1 in the front surface of the diode BD0 to the cathode K1 in the back surface through the diode BD0, and then flows to the positive electrode terminal P through the wiring pattern C10 in the conductive pattern 220. The current i2 supplied to the anode A0 in the front surface of the diode SBD0 also flows from the anode A0 in the front surface of the diode SBD0 to the cathode K0 in the back surface through the diode SBD0, and then flows to the positive electrode terminal P through the wiring pattern C11 in the conductive pattern 220.

As such, in an embodiment of the present disclosure, even if a large current may flow from the output terminal U, currents flow through both the diodes BD0 and SBD0. This can avoid breakdown of the diode SBD0. In the semiconductor module 80, the wiring member (for example, the wire W0 and the wiring pattern C10 in the conductive pattern 220) provided on the path P1 corresponds to the "first wiring member", and the wiring member (for example, the wires W0 and W1 and the wiring pattern C11 in the conductive pattern 220) provided on the path P2 corresponds to the "second wiring member".

<<Current from Negative Electrode Terminal N to Output Terminal U>>

Figure 9:
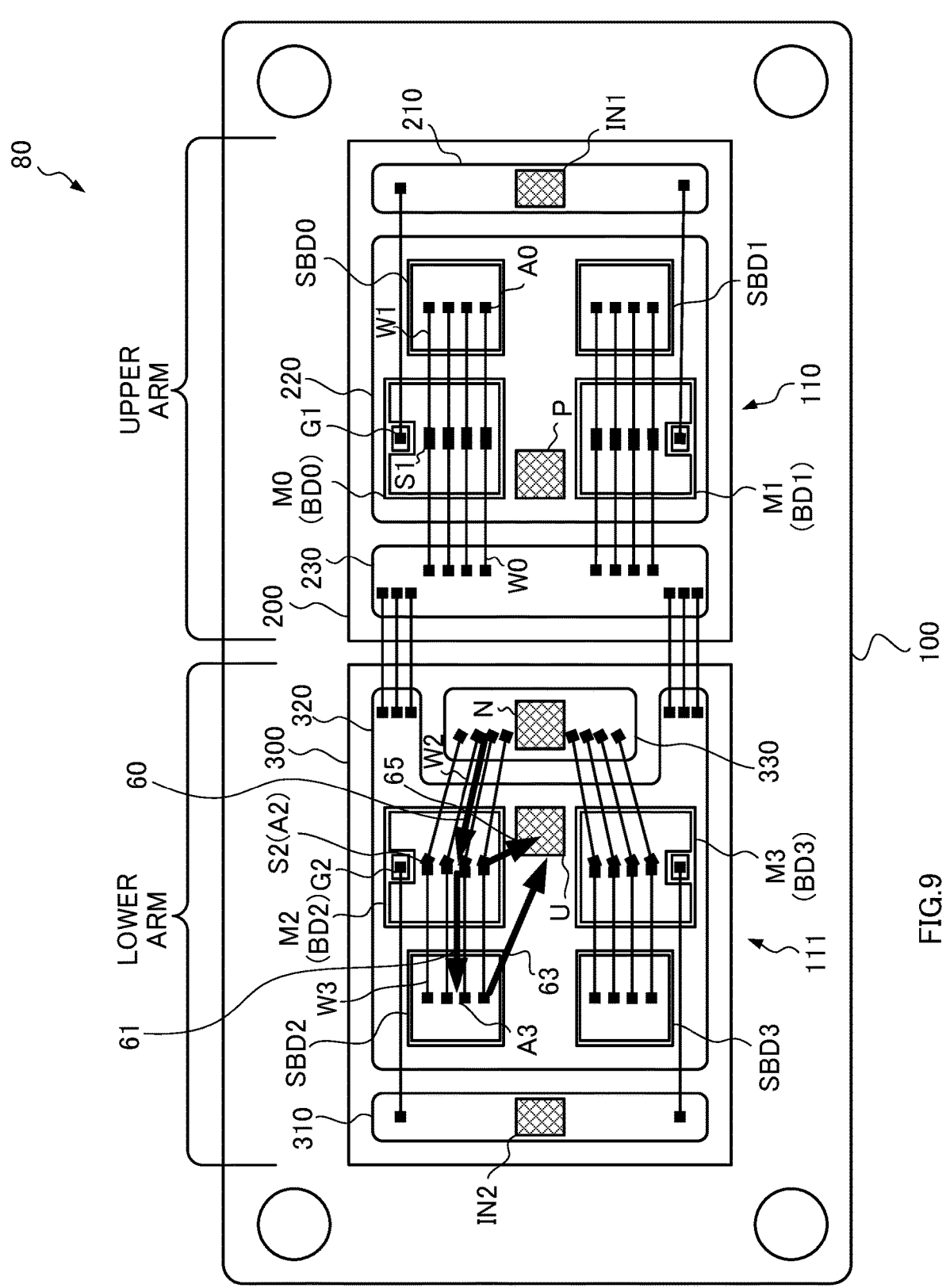
FIG. 9 is a diagram for explaining a current flowing through a device in a lower arm of a semiconductor module 80.

Next, in the semiconductor module 80, the current from the negative electrode terminal N to the output terminal U will be described with reference to FIGS. 9 and 10. The current from the negative electrode terminal N flows to the source electrode S2 of the NMOS transistor M2 (the anode A2 of the diode BD2) through the conductive pattern 330 and the wire W2. The current from the wire W2 is supplied to the anode A3 of the diode SBD2 through the wire W3.

Figure 10:
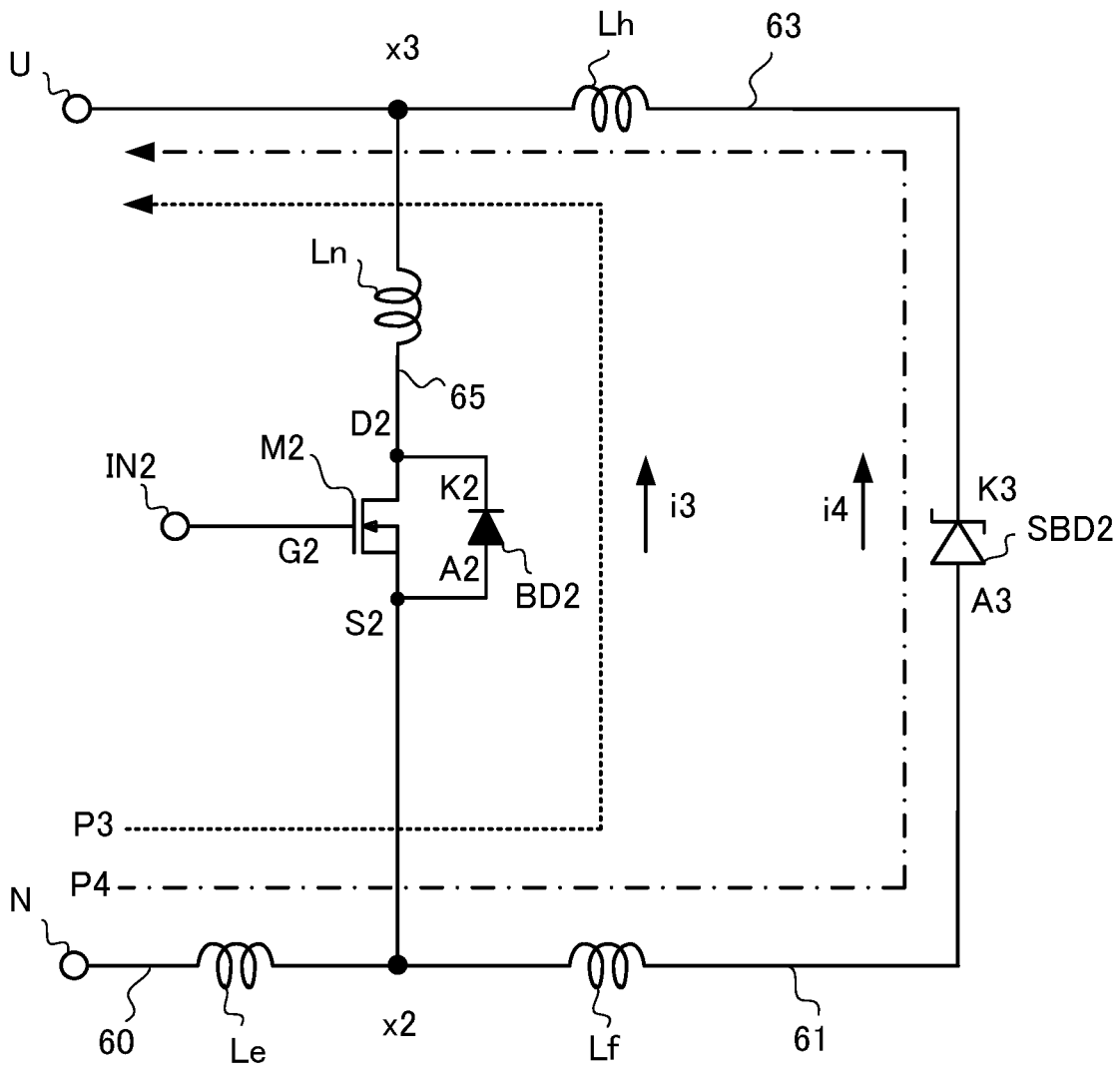
FIG. 10 is a diagram illustrating an example of an equivalent circuit of a device in a lower arm.

Here, the wire W2 coupling the negative electrode terminal N and the source electrode S2 of the NMOS transistor M2 (the anode A2 of the diode BD2) can be equivalently represented as a wiring 60 in FIG. 10. The wire W3 coupling the source electrode S2 of the NMOS transistor M2 and the anode A3 of the diode SBD2 can be equivalently represented as a wiring 61 in FIG. 10. Similarly to FIG. 6, the wiring pattern from the cathode K2 to the output terminal U can be equivalently represented as a wiring 65, and the wiring pattern from the cathode K3 to the output terminal U can be equivalently represented as a wiring 63.

In an embodiment of the present disclosure, the inductance of the wiring on the path P4 is increased such that the conditions of the expression (3) are satisfied. More specifically, for example, the inductances Lf and Lh are increased such that the difference between the inductance (Le+Lf+Lh) on the path P4 and the inductance (Le+Ln) on the path P3 is 0.18 nH or more.

Thus, the current i3 supplied to the source electrode S2 in the front surface of the NMOS transistor M2 (the anode A2 of the diode BD2), in the currents from the negative electrode terminal N, flows from the anode A2 in the front surface of the diode BD2 to the cathode K2 in the back surface through the diode BD2, and then flows to the output terminal U through a wiring pattern (not illustrated) in the conductive pattern 320. The current i4 supplied to the anode A3 in the front surface of the diode SBD2 also flows from the anode A3 in the front surface of the diode SBD2 to the cathode K3 in the back surface through the diode SBD2, and then flows to the output terminal U through the wiring pattern (not illustrated) in the conductive pattern 320.

As a result, in an embodiment of the present disclosure, even when a large current may flow from the negative electrode terminal N, currents flow through both the diodes BD2 and SBD2. This can avoid breakdown of the diode SBD2.

===Other Embodiments===

Here, for example, in order to avoid breakdown of the diode SBD0 of the upper arm caused by the current, at least one of the inductance Lb of the wiring 51 and the inductance Ld of the wiring 53 in FIG. 2 has only to be increased.

<<When Wiring 51 is Realized with Wire>>

When the wiring 51 is realized with a wire, the inductance Lb can be increased by increasing the length of the wire, by reducing the cross-sectional area of the wire, or by increasing the curvature of the wire.

<<Adjusting Wire Length>>

Figure 11:
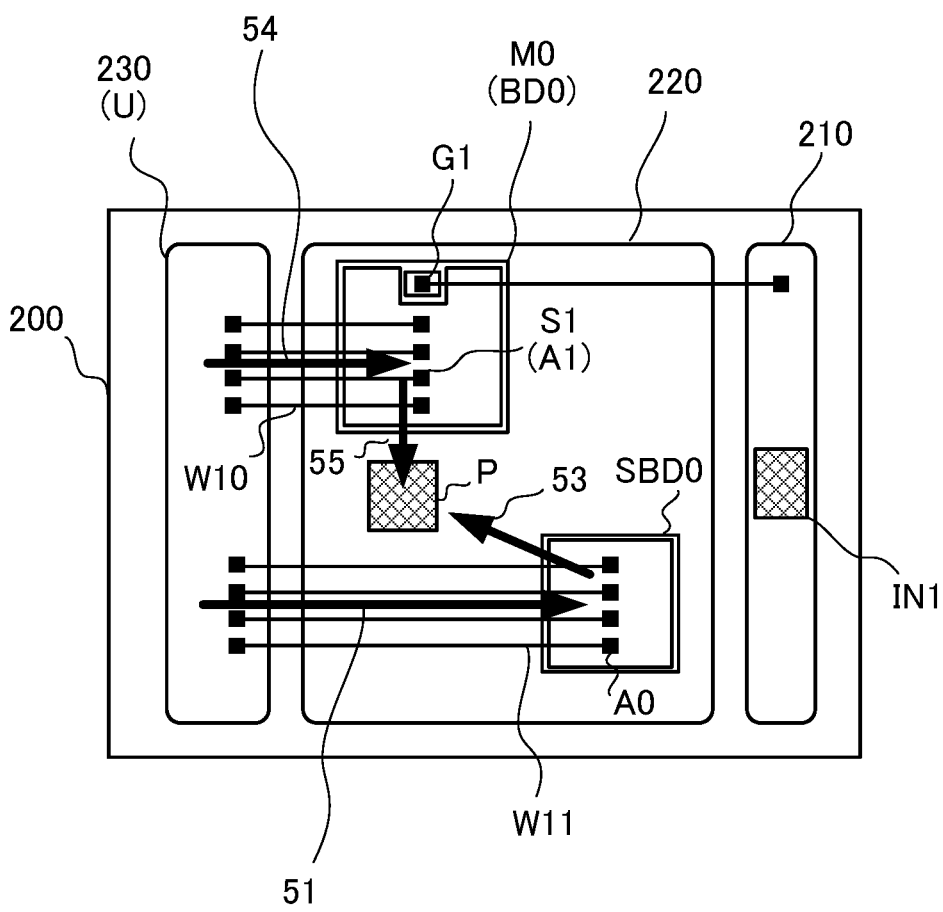
FIG. 11 is a diagram illustrating an example of an embodiment in which the length of a wire is adjusted.

FIG. 11 is a diagram for explaining an embodiment in which the length of the wire is adjusted. In FIG. 11, the configurations and components denoted by the same reference numerals as those in FIG. 4 are the same. Thus, a wire W10 to the NMOS transistor M0 and a wire W11 to the diode SBD0 will be mainly described here. In FIG. 11, it is assumed that the diode SBD0 is mounted at a position away from the NMOS transistor M0 in the conductive pattern 220.

The wire W10 couples the conductive pattern 230 electrically coupled to the output terminal U and the source electrode S1 of the NMOS transistor M0 (the anode A1 of the diode BD0).

The wire W11 is longer than the wire W10, and couples the conductive pattern 230 to the anode A0 of the diode SBD0. Since the wires W10 and W11 are the same (for example, in cross-sectional area and curvature) except for the length, the wire W11 has an inductance larger than that of the wire W10.

Figure 12:
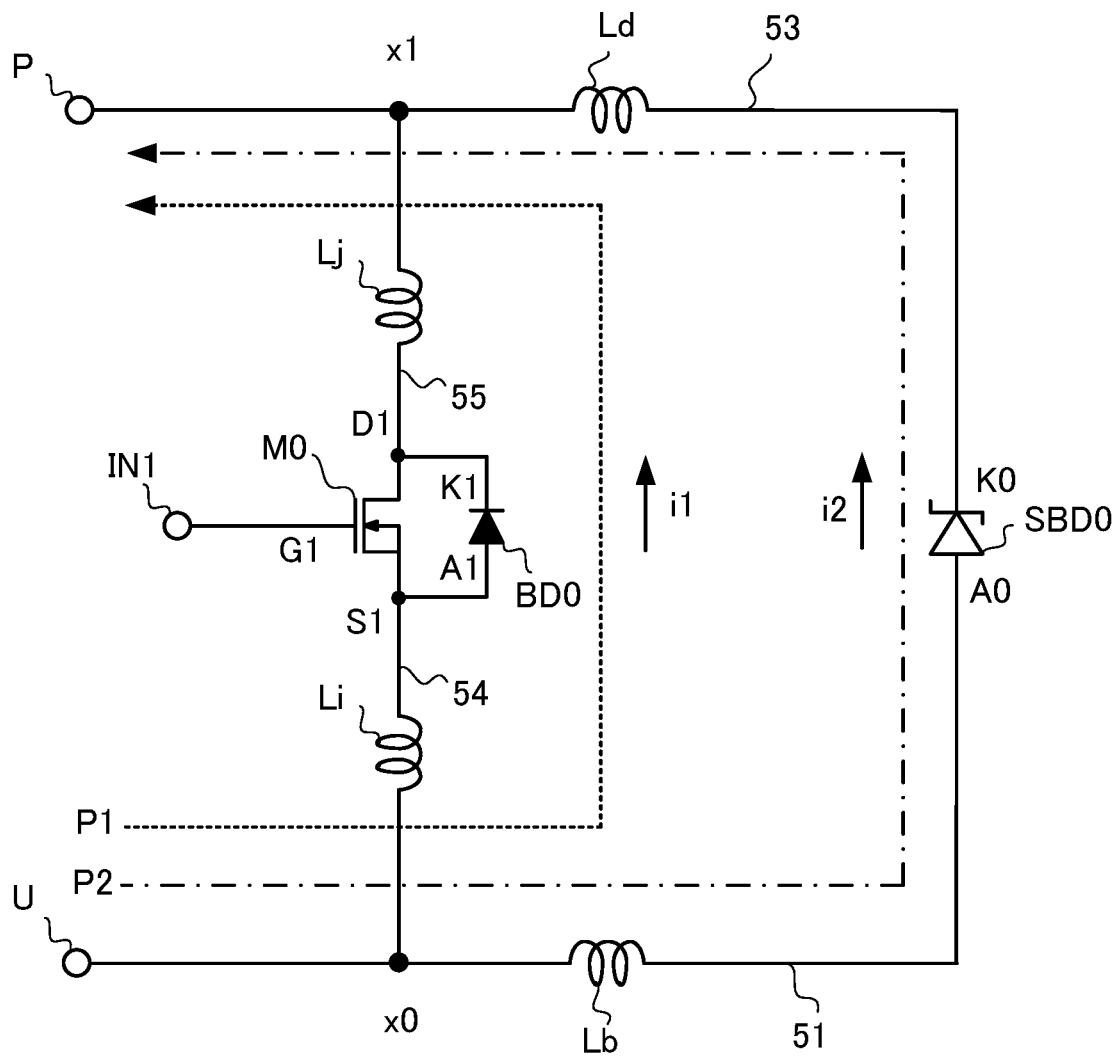
FIG. 12 is a diagram illustrating an equivalent circuit according to an embodiment illustrated in FIG. 11.

FIG. 12 is a diagram illustrating the configuration of FIG. 11 using an equivalent circuit. Here, the wiring including the conductive pattern 230 and the wire W10 coupling the output terminal U to the source electrode S1 of the NMOS transistor M0 (the anode A1 of the diode BD0) can be equivalently represented as a wiring 54. The wire W11 coupling the output terminal U to the anode A0 of the diode SBD0 can be equivalently represented as a wiring 51. The wiring pattern from the cathode K1 of the diode BD0 to the positive electrode terminal P can be equivalently represented as a wiring 55, and the wiring pattern from the cathode K0 of the diode SBD0 to the positive electrode terminal P can be equivalently represented as a wiring 53.

In such an embodiment, the inductance on the path P2 (Lb+Ld) is set larger than the inductance on the path P1 (Li+Lj), and the length of the wire W11 is increased such that the expression (3) is satisfied, for example. As a result, even when a large current flows from the output terminal U, breakdown of the diode SBD0 can be avoided. Here, the wire W10 corresponds to the "first wire", and the wire W11 corresponds to the "second wire".

<<Adjusting Cross-Sectional Area of Wire>>

Figure 13:
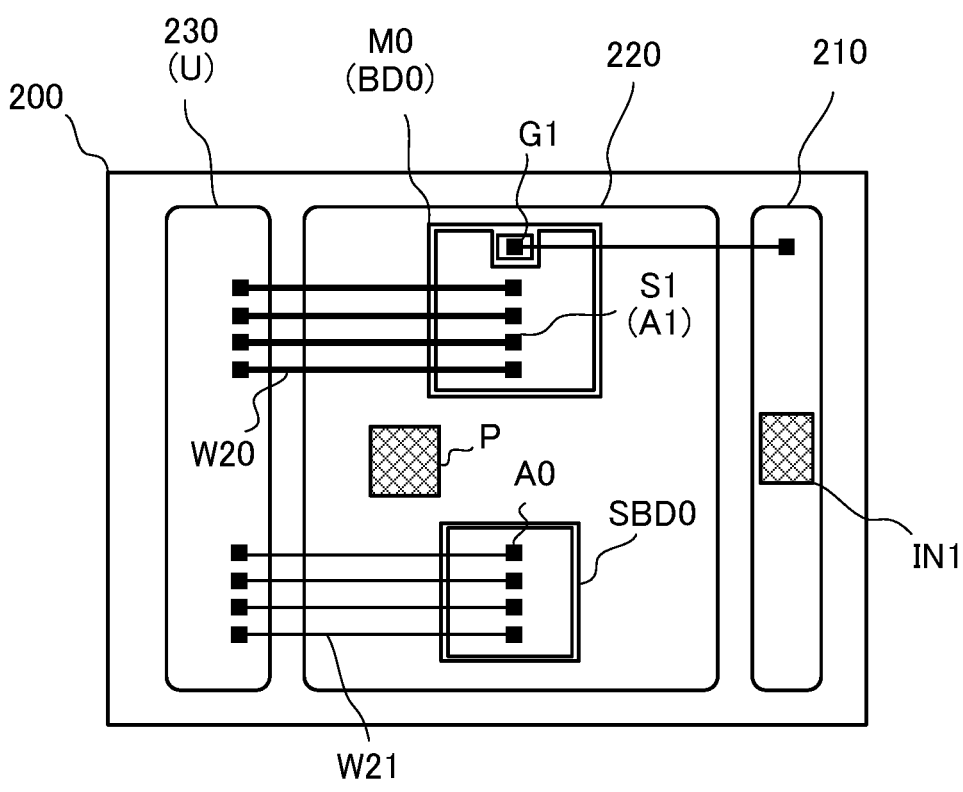
FIG. 13 is a diagram illustrating an example of an embodiment in which the cross-sectional area of a wire is adjusted.

FIG. 13 is a diagram for explaining an embodiment in which the cross-sectional area of the wire is adjusted. In FIG. 13, the configurations and components denoted by the same reference numerals as those in FIG. 4 are the same. Thus, a wire W20 to the NMOS transistor M0 and a wire W21 to the diode SBD0 will be mainly described.

The wire W20 has a larger cross-sectional area (i.e., thicker) than the wire W21, and couples the conductive pattern 230 coupled to the output terminal U and the source electrode S1 of the NMOS transistor M0 and the anode A1 of the diode BD0. For example, the wire W20 has a diameter of 400 μm and the wire W21 has a diameter of 250 μm.

The wire W21 couples the conductive pattern 230 and the anode A0 of the diode SBD0. Since the wires W20 and W21 are the same (for example, in length and curvature) except for the cross-sectional area, the wire W21 has an inductance larger than that of the wire W20.

Since the coupling relationship between the output terminal U and the positive electrode terminal P in FIG. 13 is the same as the coupling relationship between the output terminal U and the positive electrode terminal P in FIG. 11, an equivalent circuit according to such an embodiment of FIG. 13 is also as illustrated in FIG. 12. The inductance Lb is increased as the cross-sectional area of the wire W21 is reduced, and thus breakdown of the diode SBD0 can be avoided.

Here, the number of the wires W20 (4 wires) corresponds to the number of the wires W21 (4 wires), meanwhile the wires W21 each having a smaller cross-sectional area are used. However, the present disclosure is not limited thereto. For example, even when the wires W20 and W21 having the same cross-sectional area are used and the number of the wires W21 is set smaller than that of the wires W20, the same effect as that of an embodiment of the present disclosure can be achieved. Here, the wire W20 corresponds to the "first wire", and the wire W21 corresponds to the "second wire".

<<Adjusting Curvature of Wire>>

Figure 14:
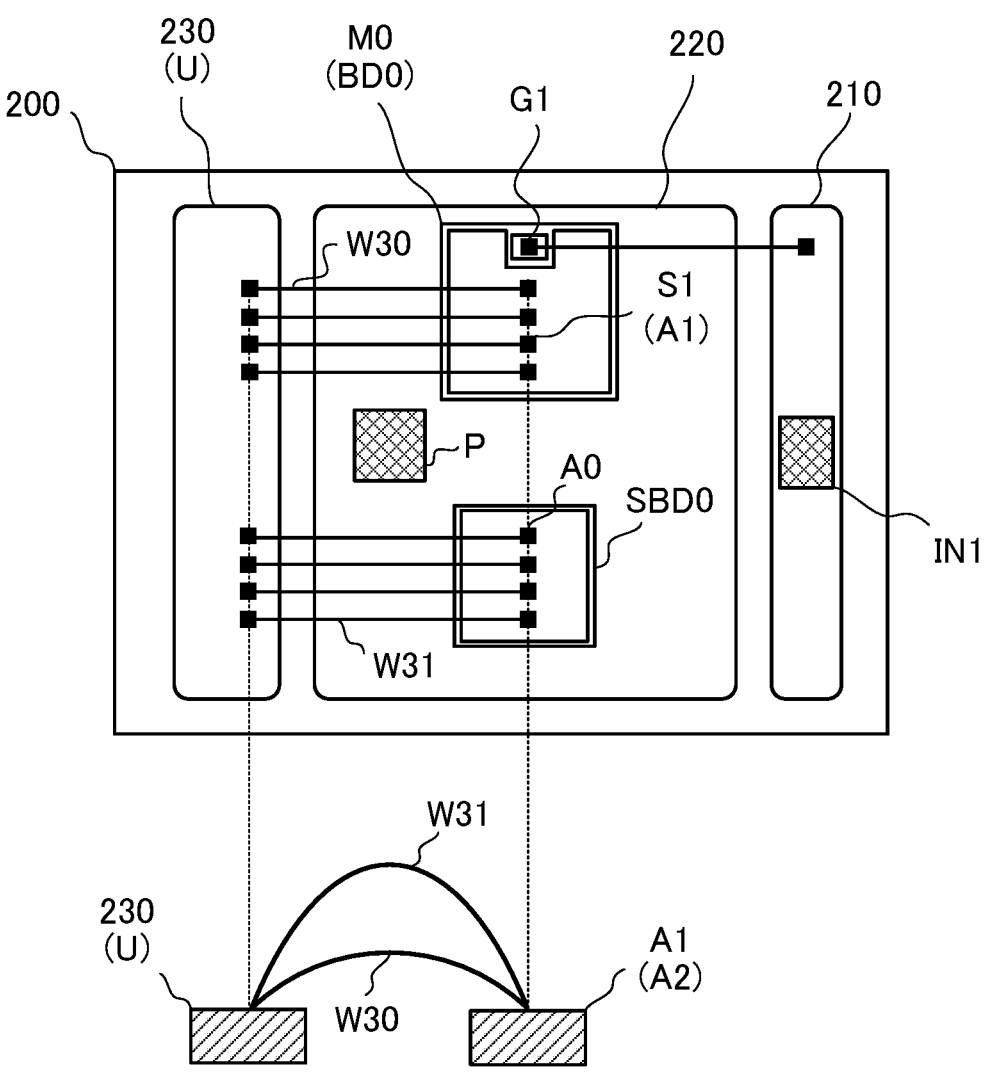
FIG. 14 is a diagram illustrating an example of an embodiment in which a curvature of a wire is adjusted.

FIG. 14 is a diagram for explaining an embodiment in which the curvature of the wire is adjusted. In FIG. 14, the configurations and components denoted by the same reference numerals as those in FIG. 4 are the same. Thus, a wire W30 to the NMOS transistor M0 and a wire W31 to the diode SBD0 will be mainly described here.

The wire W30 couples the conductive pattern 230 coupled to the output terminal U and the source electrode S1 of the NMOS transistor M0 and the anode A1 of the diode BD0.

The wire W31 has a larger curvature than the wire W30, and couples the conductive pattern 230 and the anode A0 of the diode SBD0. As the curvature (degree of bending) of the wire W31 is increased, the length of the wire W31 is also increased. Here, for example, since the wires W30 and W31 have the same cross-sectional area, the wire W31 has an inductance larger than that of the wire W30.

Since the coupling relationship between the output terminal U and the positive electrode terminal P in FIG. 14 is the same as the coupling relationship between the output terminal U and the positive electrode terminal P in FIG. 11, an equivalent circuit according to such an embodiment of FIG. 14 is also as illustrated in FIG. 12. The inductance Lb is increased as the curvature of the wire W31 is increased, for example, and thus breakdown of the diode SBD0 can be avoided. Here, the wire W30 corresponds to the "first wire", and the wire W31 corresponds to the "second wire".

<<When Wiring 53 is Realized with Wiring Pattern>>

Next, a description will be given of a case where the wiring 53 in FIG. 2 is realized with a wiring pattern. Here, when the wiring 53 is realized with a wiring pattern, the inductance Ld can be increased, for example, by increasing the length of the wiring pattern, by reducing the thickness of the wiring pattern, or by reducing the width of the wiring pattern. The description has already been given, with reference to FIG. 6, of the case where the inductance Ld is increased by increasing the length of the wiring pattern. Accordingly, the remaining two methods will be described here.

<<Adjusting Thickness and Width of Wiring Pattern>>

Figure 15:
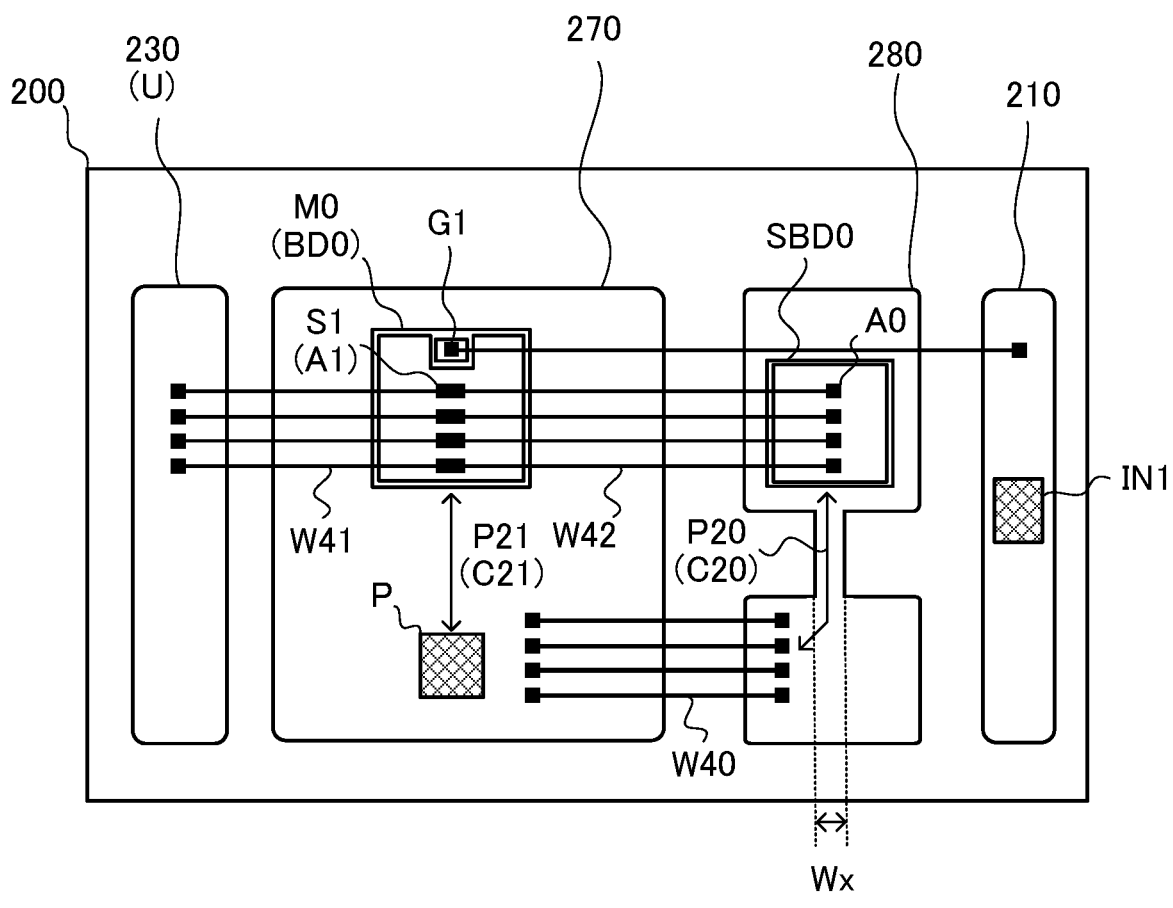
FIG. 15 is a diagram illustrating an example of an embodiment in which a wiring pattern is adjusted.
Figure 16:
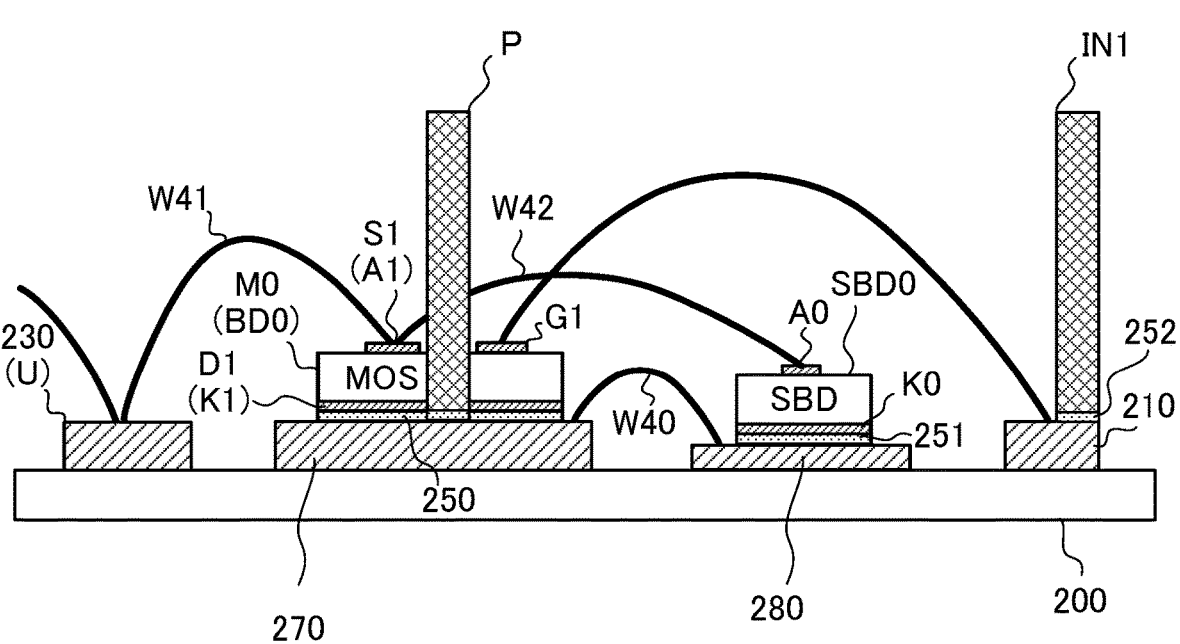
FIG. 16 is a schematic diagram for explaining the thicknesses of conductive patterns 240 and 250.

FIGS. 15 and 16 are diagrams for explaining an embodiment in which the thickness and width of a wiring pattern are adjusted. In FIGS. 15 and 16, the configurations and components denoted by the same reference numerals as those in FIGS. 4 and 5 are the same. Thus, conductive patterns 270 and 280 and wires W40 to W42 will be described here.

The positive electrode terminal P on the power supply side and the NMOS transistor M0 are mounted to the conductive pattern 270.

The conductive pattern 280 is thinner than the conductive pattern 270, and has the diode SBD0 mounted thereto. In the conductive pattern 280, a width Wx of a region between a region in which the diode SBD0 is mounted and a region in which the wire W40 is coupled is reduced. The conductive patterns 270 and 280 are coupled with the wire W40.

The wire W41 couples the conductive pattern 230 electrically coupled to the output terminal U and the source electrode S1 of the NMOS transistor M0 (the anode A1 of the diode BD0).

The wire W42 couples the source electrode S1 of the NMOS transistor M0 (the anode A1 of the diode BD0) and the anode A0 of the diode SBD0.

Here, a current from the conductive pattern 230 electrically coupled to the output terminal U flows to the source electrode S1 (anode A1) through the wire W41. Then, the current from the source electrode S1 flows to the anode A0 through the wire W42. The current from the anode A1 flows to the positive electrode terminal P through the diode BD0, the cathode K1 in the back surface side, and the wiring pattern C21 in the conductive pattern 270. The current from the anode A0 flows to the positive electrode terminal P through the diode SBD0, the cathode K2 in the back surface side, the wiring pattern C20, the wire W40, and the conductive pattern 270. Accordingly, an embodiment of FIG. 15 can be represented by the equivalent circuit illustrated in FIG. 8, similarly to an embodiment of FIG. 4.

In an embodiment of the present disclosure, the conductive pattern 280 having the path P20 formed therein is thinner than the conductive pattern 270, and the width Wx of the path P20 is also smaller. Thus, the wiring pattern C20 conceptually formed on the path P20 has an inductance larger than that of the wiring pattern C21 conceptually formed on the path P21. Accordingly, by using the wiring pattern C20 having a large inductance, the inductance Ld of the wiring 53 in FIG. 8 can be increased. As a result, the use of the configuration illustrated in FIGS. 15 and 16 makes it possible to avoid breakdown of the diode SBD0.

<<Other Configuration Examples of Part of Semiconductor Modules>>

Figure 17:
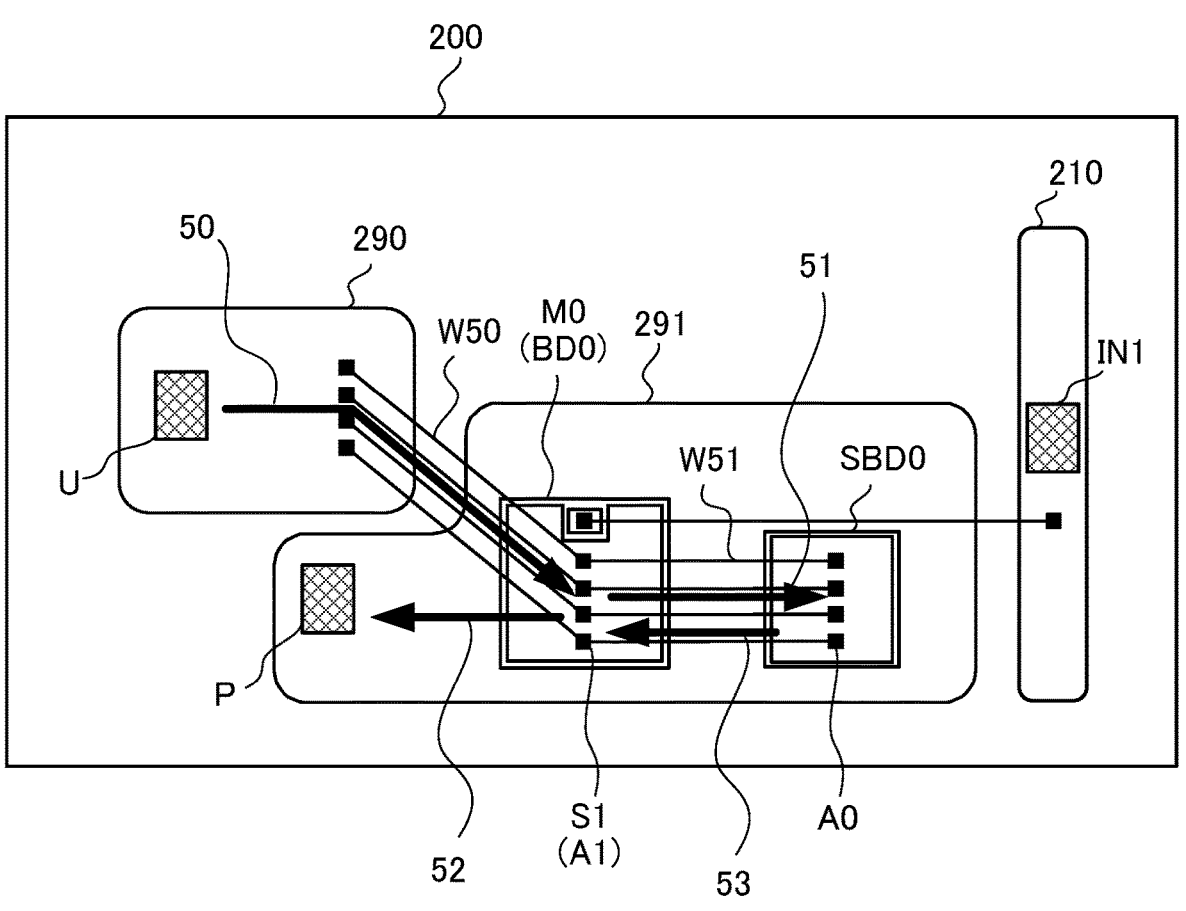
FIG. 17 is a diagram illustrating an example of a configuration of an upper arm of a semiconductor module 80.

FIG. 17 is a diagram illustrating a configuration of elements of an upper arm of a semiconductor module. The configurations denoted by the same reference numerals in FIGS. 17 and 4 are the same. Thus, conductive patterns 290 and 291 and wires W50 and W51 will be mainly described here.

The conductive pattern 290 has the output terminal U mounted thereto, and the wire W50 couples the conductive pattern 290 to the source electrode S1 of the NMOS transistor M0 (the anode A1 of the diode BD0).

The conductive pattern 291 has the positive electrode terminal P, the NMOS transistor M0, and the diode SBD0 mounted thereto. The wire W51 couples the source electrode S1 of the NMOS transistor M0 (the anode A1 of the diode BD0) to the anode A0 of the diode SBD0.

Figure 18:
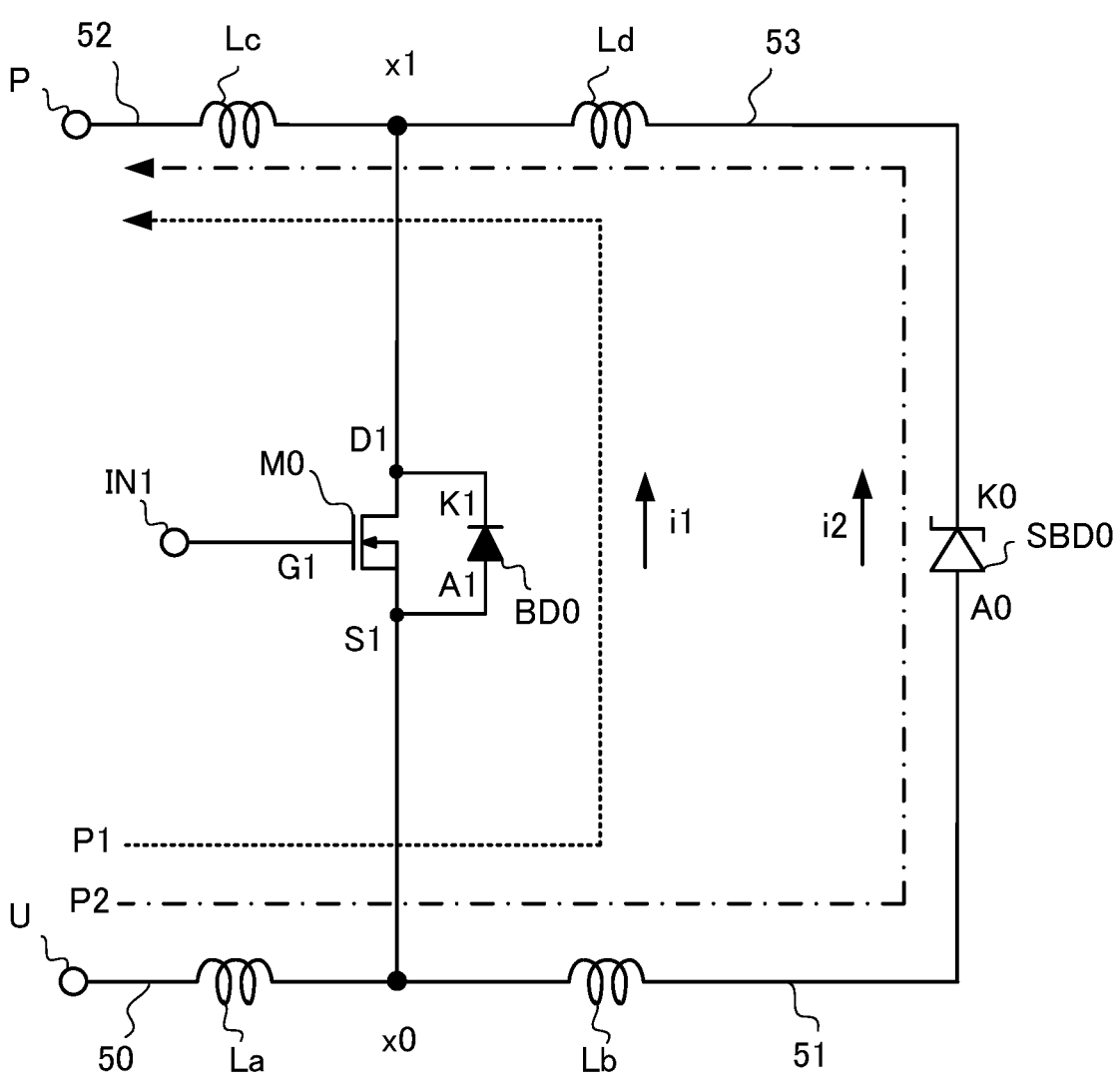
FIG. 18 is a diagram illustrating an equivalent circuit according to an embodiment illustrated in FIG. 17.

FIG. 18 is a diagram illustrating the configuration of FIG. 17 in an equivalent circuit. Here, the wiring including the conductive pattern 290 and the wire W50 coupling the output terminal U to the source electrode S1 of the NMOS transistor M0 (the anode A1 of the diode BD0) can be equivalently represented as a wiring 50. The wire W51 coupling the source electrode S1 of the NMOS transistor M0 (anode A1 of the diode BD0) and the anode A0 of the diode SBD0 can be equivalently represented as the wiring 51. The wiring pattern from the cathode K0 of the diode SBD0 to the cathode K1 of the diode BD0 can be equivalently represented as a wiring 53, and the wiring pattern from the cathode K1 of the diode BD0 to the positive electrode terminal P can be equivalently represented as a wiring 52.

In such an embodiment, the inductance on the path P2 (La+Lb+Lc+Ld) is larger than the inductance on the path P1 (La+Lc) without fail. In an embodiment of the present disclosure, the length of the wire W51 is increased, for example, such that the relationship of Lb+Ld>0.18 nH is satisfied, for example. As a result, even when a large current flows from the output terminal U, breakdown of the diode SBD0 can be avoided. Here, the wire W50 corresponds to the "first wire", and the wires W50 and W51 correspond to the "second wire".

Figure 19:
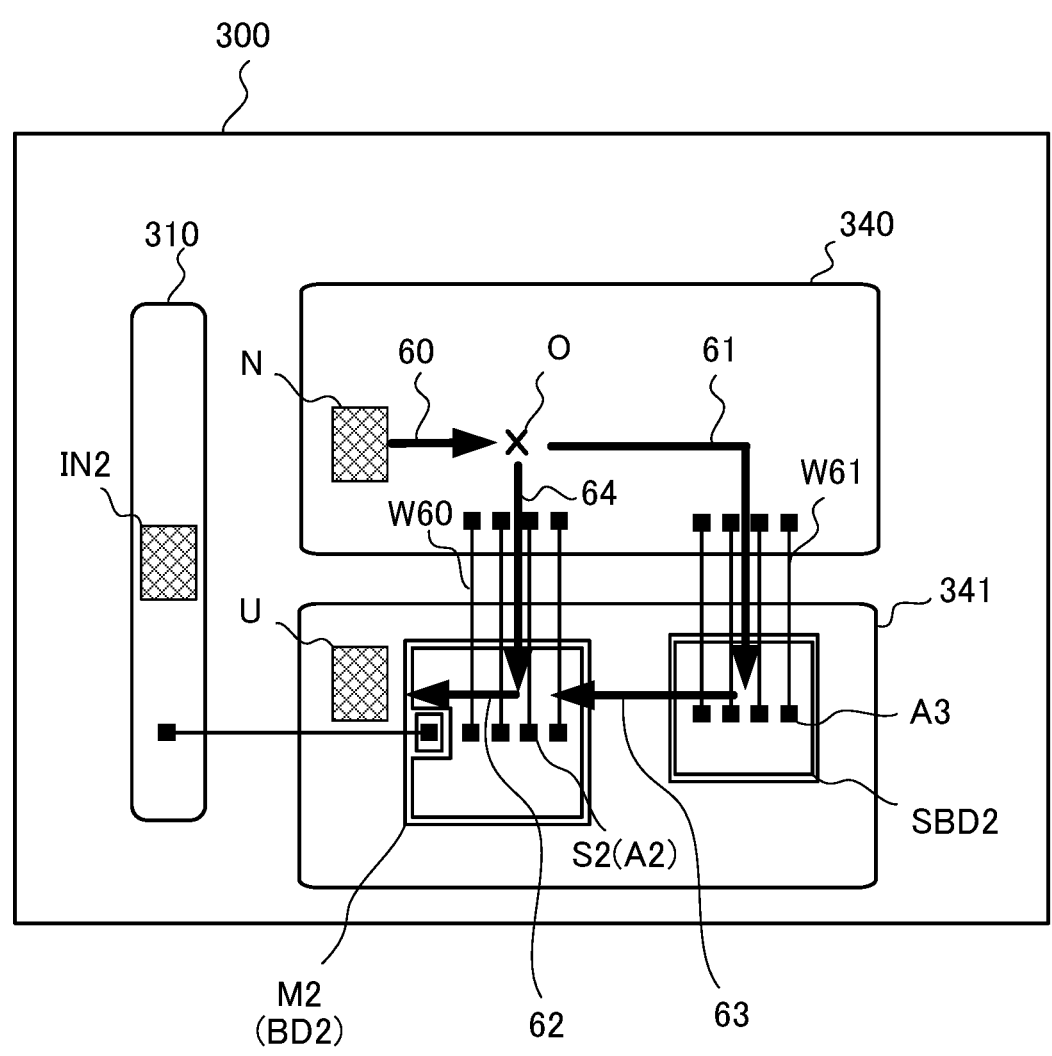
FIG. 19 is a diagram illustrating an example of a configuration of a lower arm of a semiconductor module 80.

FIG. 19 is a diagram illustrating a configuration of elements of a lower arm of a semiconductor module. The configurations and components denoted by the same reference numerals are the same between FIGS. 19 and 4. Thus, conductive patterns 340 and 341 and wires W60 and W61 will be mainly described here.

The conductive pattern 340 has the negative electrode terminal N mounted thereto, and the wire W60 couples the conductive pattern 340 to the source electrode S2 of the NMOS transistor M2 (the anode A2 of the diode BD2). The wire W61 couples the conductive pattern 340 to the anode A3 of the diode SBD2.

The conductive pattern 341 has the output terminal U, the NMOS transistor M2, and the diode SBD2 mounted thereto.

Figure 20:
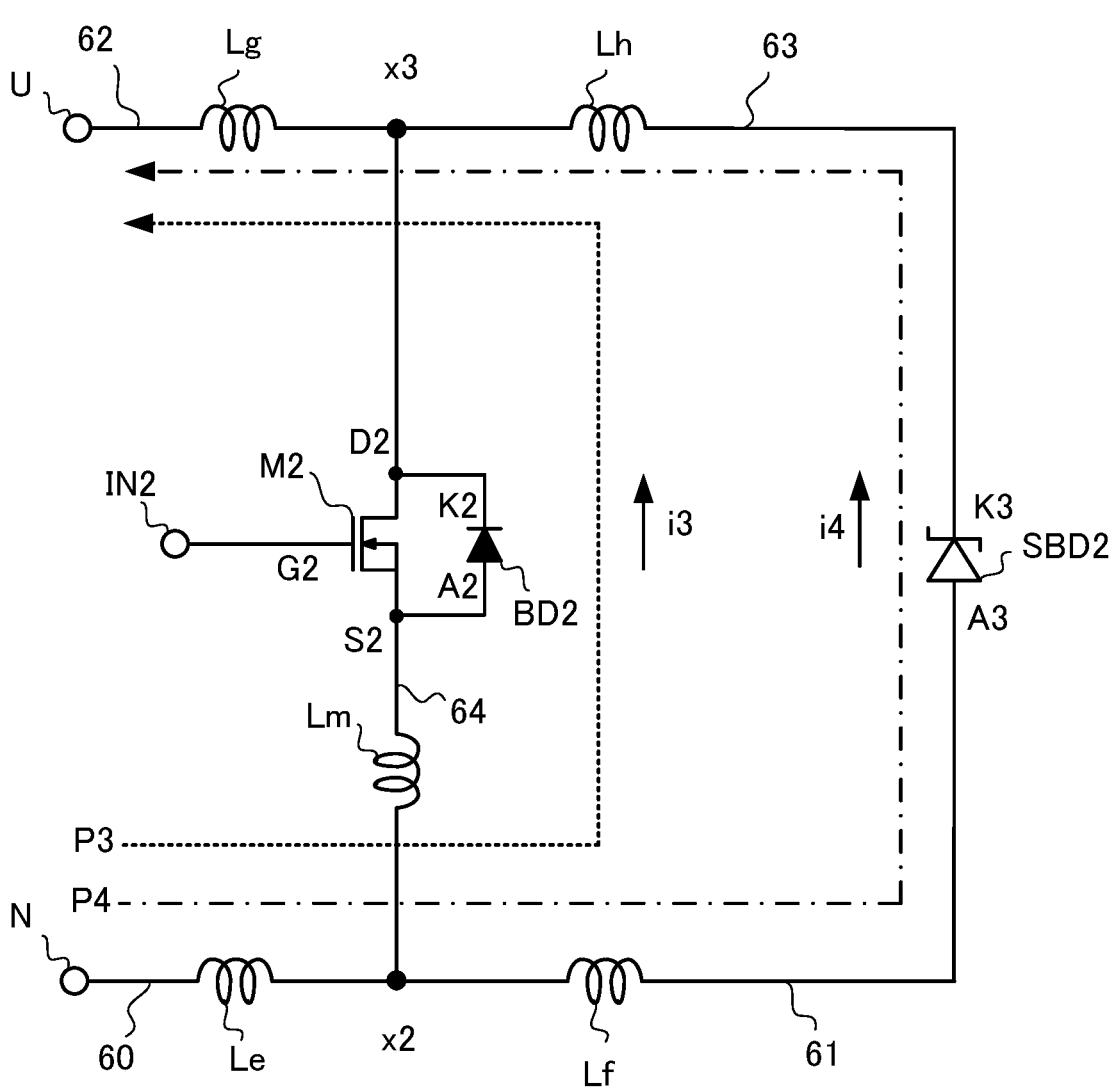
FIG. 20 is a diagram illustrating an equivalent circuit according to an embodiment illustrated in FIG. 17.

FIG. 20 is a diagram illustrating the configuration of FIG. 19 in an equivalent circuit. Here, the wiring pattern conceptually formed from the negative electrode terminal N to a position O in the conductive pattern 340 can be equivalently represented as a wiring 60. The position O is a position at which the current from the negative electrode terminal N is conceptually divided into the NMOS transistor M2 and the diode SBD2 in the conductive pattern 340, and corresponds to the node x2.

The wiring including the wiring pattern from the position O to the source electrode S2 of the NMOS transistor M2 (the anode A2 of the diode BD2) and the wire W60 can be equivalently represented as a wiring 64. The wiring including the wiring pattern from the position O to the anode A3 of the diode SBD2 and the wire W61 can be equivalently represented as a wiring 61. The wiring pattern from the cathode K3 of the diode SBD2 to the cathode K2 of the diode BD2 can be equivalently represented as a wiring 63. The wiring pattern from the cathode K2 of the diode BD2 to the output terminal U can be equivalently represented as a wiring 62.

In such an embodiment, the length of the wire W61 is increased, for example, such that the inductance on the path P4 (Le+Lf+Lg+Lh) is larger than the inductance on the path P3 (Le+Lm+Lg). As a result, even when a large current flows from the negative electrode terminal N, breakdown of the diode SBD2 can be avoided. In an embodiment of the present disclosure, it is preferable that (Lf+Lh)−Lm>0.18 nH is satisfied, and it is more preferable that (Lf+Lh)−Lm>0.36 nH is satisfied. Accordingly, with (Lf+Lh) being set larger, even when there are variations in the characteristics of the elements and/or the inductance of the wire W60, for example, the current flowing through the diode SBD2 can be reduced.

===Summary===

The electronic circuit 10 and the semiconductor module 80 according to an embodiment of the present disclosure have been described above. As illustrated in FIG. 2, the inductance on the path P2 is larger than the inductance on the path P1 in the electronic circuit 10. Thus, the current from the output terminal U flows not only through the diode SBD0 on the path P2 but also through the diode BD0 on the path P1. Accordingly, in the electronic circuit 10, it is avoided that a large current flowing through the diode SBD0, which is a free-wheeling diode, resulting in breakdown of the diode SBD0.

A general bipolar transistor may be used as the switching device. And, with a PN diode having a PN junction and a Schottky diode having a Schottky junction being coupled, as free-wheeling diodes, to the bipolar transistor, the same effect as that in an embodiment of the present disclosure can be achieved. However, in an embodiment of the present disclosure, the NMOS transistor M0 is used as the switching device. Thus, the parasitic diode (body diode) of the NMOS transistor M0 can be used as the free-wheeling diode without separately providing the PN diode.

The NMOS transistor M0 and the diode SBD0 having a Schottky junction are elements using a wide bandgap semiconductor. Thus, in an embodiment of the present disclosure, it is possible to reduce the loss in driving the load, while improving the withstand voltage of the electronic circuit 10.

The diode SBD0 having a Schottky junction is coupled in anti-parallel to the NMOS transistor M0 such that the diode can operate as a free-wheeling diode when the NMOS transistor M0 is off.

The semiconductor module 80 is a device including the electronic circuit 10 in which the inductance on the path P2 through the SBD0 is larger than the inductance on the path P1 through the NMOS transistor M0. Accordingly, when such a semiconductor module 80 is used, the diode SBD0 having a Schottky junction can be protected from a large current.

In the semiconductor module 80, as illustrated in FIG. 4, the wire W0 from the conductive pattern 230 is coupled to the diode BD0 having a PN junction, and the wire W1 from the diode BD0 is coupled to the diode SBD0 having a Schottky junction. Accordingly, the inductance from the conductive pattern 230 to the diode SBD0 can be set larger than the inductance from the conductive pattern 230 to the diode BD0.

As illustrated in FIG. 11, the conductive pattern 230 and the diode SBD0 may be coupled by using the wire W11 longer than the wire W10. In such a case as well, the inductance from the conductive pattern 230 to the diode SBD0 can be set larger than the inductance from the conductive pattern 230 to the diode BD0.

As illustrated in FIG. 13, the conductive pattern 230 and the diode SBD0 may be coupled by using the wire W21 having a cross-sectional area smaller than that of the wire W20. In such a case as well, the inductance from the conductive pattern 230 to the diode SBD0 can be set larger than the inductance from the conductive pattern 230 to the diode BD0.

As illustrated in FIG. 14, the conductive pattern 230 and the diode SBD0 may be coupled by using the wire W31 having a curvature larger than that of the wire W30. In such a case as well, the inductance from the conductive pattern 230 to the diode SBD0 can be set larger than the inductance from the conductive pattern 230 to the diode BD0.

Further, in the semiconductor module 80, the U terminal (or the conductive pattern 230 coupled to the U-terminal), the NMOS transistor M0, and the diode SBD0 are arranged in this order along the longitudinal direction (predetermined direction) of the semiconductor module 80. In other words, the NMOS transistor M0 is provided between the U-terminal and the diode SBD0. If the U-terminal, the diode SBD0, and the NMOS transistor M0 are arranged in this order along the longitudinal direction, generally, the inductance of the wiring from the output terminal U to the diode SBD0 is smaller than that of the wiring from the U-terminal to the diode BD0. However, with the elements and the like being arranged in the order in an embodiment of the present disclosure, the inductance of the wiring from the U-terminal to the diode SBD0 can be set larger than the inductance of the wiring from the U-terminal to the diode BD0 serving as a parasitic element.

Further, in the semiconductor module 80, the wire W0, in the wires (for example, the wires W0 and W1) coupling the U-terminal to the diode SBD0, is used as a wire coupling the U-terminal to the diode BD0. In such a case, the inductance of the wire coupling the U-terminal to the diode SBD0 is larger than the inductance of the wire coupling the U-terminal to the diode BD0 without fail. Note that, in the semiconductor module 80, the wires W0 and W1 correspond to the "second wire", and the wire W0 corresponds to the "first wire".

For example, in order to increase the inductance on the path P2, the inductance of the wiring pattern, instead of the wire, may be increased. In such a case as well, the diode SBD0 can be protected.

As illustrated in FIG. 6, when the path P2 includes the wiring pattern C11 longer than the wiring pattern C10, the inductance on the path P2 can be increased. Note that, the wiring pattern C10 corresponds to the "first wiring pattern", and the wiring pattern C11 corresponds to the "second wiring pattern".

For example, as illustrated in FIG. 15, the thickness of the conceptually formed wiring pattern C20 may be set smaller than the thickness of the wiring pattern C21. In such a case as well, the inductance on the path P2 can be increased.

As illustrated in FIG. 15, for example, in a case where the width Wx of the wiring pattern C20 is reduced as well, the inductance on the path P2 can be increased.

As illustrated in FIG. 6, the wiring pattern C10 is determined based on the distance between the positive electrode terminal P and the diode BD0 in the conductive pattern 220, and the wiring pattern C11 is determined based on the distance between the positive electrode terminal P and the diode BD0 in the conductive pattern 220.

Further, in the semiconductor module 80, the conductive pattern 220 having the positive electrode terminal P mounted thereto is provided between the conductive pattern 210 having the control terminal IN1 mounted thereto and the conductive pattern 230 electrically coupled to the output terminal U. The conductive pattern 220 corresponds to the "first conductive pattern", the conductive pattern 230 corresponds to the "second conductive pattern", and the conductive pattern 210 corresponds to the "third conductive pattern".

The present disclosure is directed to provision of an electronic circuit and a semiconductor module capable of avoiding breakdown of a free-wheeling diode.

According to the present disclosure, it is possible to provide an electronic circuit and a semiconductor module capable of avoiding breakdown of a free-wheeling diode.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:
1. An electronic circuit having a first terminal and a second terminal, the electronic circuit comprising:
    a first diode having a PN junction where a forward voltage is a first voltage;
    a second diode having a Schottky junction where the forward voltage is a second voltage that is smaller than the first voltage;

18 a first wiring member coupling the first terminal to the second terminal via the first diode; and
    a second wiring member coupling the first terminal to the second terminal via the second diode, the second wiring member having an inductance larger than an inductance of the first wiring member, wherein the first diode, the second diode, the first wiring member and the second wiring member are configured to satisfy a condition of (L2–LI)>(Vf1–Vf2)×(1/(dI/dt)), wherein
L2 is the inductance of the second wiring member,
LI is the inductance of the first wiring member,
Vf1 is the first voltage, Vf2 is the second voltage, and
I is a current flowing from the first terminal to the second terminal through the first wiring member, or flowing from the first terminal to the second terminal through the second wiring member, wherein a difference between the inductance of the second wiring member and the inductance of the first wiring member is larger than 0.18 nH.
2. The electronic circuit according to claim 1, further comprising a switching device, such that the first diode is a parasitic diode of the switching device.
3. The electronic circuit according to claim 2, wherein each of the switching device and the second diode is a device using a wide bandgap semiconductor.
4. The electronic circuit according to claim 2, wherein the second diode is coupled in anti-parallel with the switching device.
5. A semiconductor module comprising the electronic circuit according to claim 1.
6. The semiconductor module according to claim 5, wherein
    the first wiring member includes a first wire provided between the first terminal and the first diode, and
    the second wiring member includes a second wire provided between the first terminal and the second diode, the second wire having an inductance larger than an inductance of the first wire.
7. The semiconductor module according to claim 6, wherein the second wire is longer than the first wire.
8. The semiconductor module according to claim 6, wherein the second wire has a cross-sectional area smaller than a cross-sectional area of the first wire.
9. The semiconductor module according to claim 6, wherein the second wire has a curvature larger than a curvature of the first wire.
10. The semiconductor module according to claim 7, wherein the first diode is provided between the first terminal and the second diode.
11. The semiconductor module according to claim 10, wherein the second wire includes the first wire.
12. The semiconductor module according to claim 6, wherein
    the first wiring member includes a first wiring pattern provided between the second terminal and the first diode, and
    the second wiring member includes a second wiring pattern provided between the second terminal and the second diode, the second wiring pattern having an inductance larger than an inductance of the first wiring pattern.
13. The semiconductor module according to claim 12, wherein the second wiring pattern is longer than the first wiring pattern.
14. The semiconductor module according to claim 12, wherein the second wiring pattern is thinner than the first wiring pattern.

15. The semiconductor module according to claim 12, wherein the second wiring pattern has a width smaller than a width of the first wiring pattern.

16. The semiconductor module according to claim 13, further comprising:

a first conductive pattern having the first and second diodes mounted thereto on a front surface thereof, and the second terminal mounted thereto, wherein the first wiring pattern is determined by a distance from a position at which the first diode is mounted to the first conductive pattern to the second terminal, and the second wiring pattern is determined by a distance from a position at which the second diode is mounted to the first conductive pattern to the second terminal.

17. The semiconductor module according to claim 16, further comprising:

a switching device including the first diode, the switching device having a control electrode by which the switching device is controlled;

a second conductive pattern coupled to the first terminal; and a third conductive pattern coupled to the control electrode of the switching device, wherein the first conductive pattern is provided between the second and third conductive patterns.

* * * * *